US009626184B2

(12) United States Patent
Kuo

(10) Patent No.: US 9,626,184 B2
(45) Date of Patent: Apr. 18, 2017

(54) PROCESSORS, METHODS, SYSTEMS, AND INSTRUCTIONS TO TRANSCODE VARIABLE LENGTH CODE POINTS OF UNICODE CHARACTERS

(71) Applicant: Intel Corporation, Santa Clara, CA (US)

(72) Inventor: Shihjong Kuo, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 505 days.

(21) Appl. No.: 13/931,727

(22) Filed: Jun. 28, 2013

(65) Prior Publication Data

US 2015/0006857 A1    Jan. 1, 2015

(51) Int. Cl.
*G06F 9/30* (2006.01)
*H03M 7/40* (2006.01)
*H03M 7/14* (2006.01)

(52) U.S. Cl.
CPC ...... *G06F 9/30018* (2013.01); *G06F 9/30021* (2013.01); *G06F 9/30025* (2013.01); *G06F 9/30036* (2013.01); *G06F 9/30145* (2013.01); *H03M 7/14* (2013.01); *H03M 7/40* (2013.01); *H03M 7/4031* (2013.01)

(58) Field of Classification Search
None
See application file for complete search history.

(56) References Cited

U.S. PATENT DOCUMENTS

| 5,136,290 A | * | 8/1992 | Bond | H03M 7/425 341/106 |
| 5,675,332 A | * | 10/1997 | Limberg | H03M 7/425 341/65 |

(Continued)

FOREIGN PATENT DOCUMENTS

| CN | 102460976 A | 6/2010 |
| CN | 101849258 A | 9/2010 |

(Continued)

OTHER PUBLICATIONS

'Even faster UTF8 character counting' by Colin Percival, Jun. 5, 2008.*

(Continued)

*Primary Examiner* — Steven Snyder
(74) *Attorney, Agent, or Firm* — Vecchia Patent Agents, LLC

(57) ABSTRACT

A processor includes a plurality of packed data registers. The processor also includes a decode unit to decode a packed variable length code point length determination instruction. The instruction is to indicate a first source packed data that is to have a plurality of packed variable length code points that are each to represent a character. The instruction is also to indicate a destination storage location. The processor also has an execution unit coupled with the decode unit and the packed data registers. The execution unit, in response to the instruction, is to store a result packed data in the indicated destination storage location. The result packed data is to have a length for each of the plurality of the packed variable length code points. Other processors, methods, systems, and instructions are also disclosed.

22 Claims, 22 Drawing Sheets

(56) References Cited

U.S. PATENT DOCUMENTS

| | | | | |
|---|---|---|---|---|
| 5,963,154 | A * | 10/1999 | Wise | G06F 12/0207 341/67 |
| 6,236,342 | B1 * | 5/2001 | Symes | H03M 7/42 341/67 |
| 6,567,019 | B2 * | 5/2003 | Nakayama | H03M 7/40 341/50 |
| 6,865,668 | B1 * | 3/2005 | Benes | H04N 19/13 341/65 |
| 7,023,365 | B1 * | 4/2006 | Mitchell | H03M 7/40 341/65 |
| 7,400,271 | B2 * | 7/2008 | Cameron | G06F 17/2217 341/50 |
| 7,728,738 | B2 * | 6/2010 | Cameron | G06F 17/2217 341/50 |
| 7,773,005 | B2 * | 8/2010 | Frank | H03M 7/40 341/65 |
| 7,898,441 | B2 * | 3/2011 | Cameron | G06F 17/2217 341/50 |
| 8,159,374 | B2 * | 4/2012 | Schneider | H03M 7/3086 341/51 |
| 9,189,237 | B2 * | 11/2015 | Chen | G06F 9/30145 |
| 9,189,238 | B2 * | 11/2015 | Chen | G06F 9/30018 |
| 2002/0021233 | A1 * | 2/2002 | Nakayama | H03M 7/40 341/63 |
| 2003/0158854 | A1 * | 8/2003 | Yoshida | G06F 17/30569 |
| 2004/0044791 | A1 * | 3/2004 | Pouzzner | G06F 17/22 709/245 |
| 2004/0215647 | A1 * | 10/2004 | Farn | G06F 17/2217 |
| 2005/0108312 | A1 * | 5/2005 | Chen | G06F 9/3001 708/513 |
| 2007/0016418 | A1 * | 1/2007 | Mehrotra | G10L 19/0017 704/240 |
| 2008/0127122 | A1 * | 5/2008 | Greiner | G06F 17/2217 717/136 |
| 2008/0165038 | A1 | 7/2008 | Inoue et al. | |
| 2008/0272939 | A1 * | 11/2008 | Cameron | G06F 17/2217 341/50 |
| 2010/0141487 | A1 * | 6/2010 | Frank | H03M 7/40 341/67 |
| 2010/0302076 | A1 | 12/2010 | Cameron | |
| 2011/0037625 | A1 | 2/2011 | Joyce | |
| 2011/0128167 | A1 | 6/2011 | Schneider | |
| 2012/0221540 | A1 * | 8/2012 | Rose | G06F 17/30168 707/706 |
| 2015/0026568 | A1 * | 1/2015 | Zhao | G06F 17/211 715/254 |

FOREIGN PATENT DOCUMENTS

| | | |
|---|---|---|
| TW | 200838323 A | 9/2008 |
| TW | 200845595 A | 11/2008 |
| WO | 2014/210366 A1 | 12/2014 |

OTHER PUBLICATIONS

'Unicode HOWTO' by Python, archived on May 22, 2013.*

'7.2. codecs—Codec registry and base classes' by Python, archived on Jun. 1, 2013.*

Cameron, Robert D., "A Case Study in SIMD Text Processing with Parallel Bit Streams UTF-8 to UTF-16 Transcoding", Feb. 20-23, 2008, 8 pages.

Intel, "XML Parsing Accelerator with Intel® Streaming SIMD Extensions 4 (Intel® SSE4)", Dec. 16, 2008, 10 pages.

International Search Report and Written Opinion received for PCT Patent Application No. PCT/US2014/044419, mailed on Sep. 30, 2014, 10 pages.

Woboq, "UTF-8 processing using SIMD (SSE4)", retrieved on Dec. 16, 2014, 15 pages.

Office Action received for Taiwan Patent Application No. 103122082, mailed on Jul. 8, 2015, 5 pages of English Translation and 4 pages of Taiwan Office Action.

International Preliminary Report on Patentability and Written Opinion Received for PCT Patent Application No. PCT/US2014/044419, mailed on Jan. 7, 2016, 7 Pages.

Office Action received for Korean Patent Application No. 10-2015-7032185, mailed on Apr. 21, 2016, 5 pages (2 pages of English Translation and 3 pages of Official copy).

Office Action received for Korean Patent Application No. 10-2015-7032185, mailed on Nov. 30, 2016, 4 pages of Office Action including 1 page of English Translation.

* cited by examiner

FIG. 2

CHARACTERISTICS OF VARIABLE LENGTH UTF-8 CODE POINTS 224

| BYTES IN VARIABLE LENGTH CODE POINT | BYTE 1 bits [7:0] | BYTE 2 bits [15:8] | BYTE 3 bits [23:16] | BYTE 4 bits [31:24] | NUMBER OF SIGNATURE BITS | NUMBER OF UNICODE CODE POINT BITS |
|---|---|---|---|---|---|---|
| 1 | 0xxxxxxx | N/A | N/A | N/A | 1 | 7 |
| 2 | 110xxxxx | 10xxxxxx | N/A | N/A | 5 | 11 |
| 3 | 1110xxxx | 10xxxxxx | 10xxxxxx | N/A | 8 | 16 |
| 4 | 11110xxx | 10xxxxxx | 10xxxxxx | 10xxxxxx | 11 | 21 |

SIGNATURE BITS 226

228 UNICODE CODE POINT BITS

METHOD OF PERFORMING PACKED
VARIABLE LENGTH CODE POINT
UNICODE BITS EXTRACTION
INSTRUCTION 978

RECEIVE PACKED VARIABLE LENGTH CODE POINT CHARACTER BITS EXTRACTION INSTRUCTION INDICATING FIRST SOURCE PACKED DATA HAVING PLURALITY OF PACKED VARIABLE LENGTH CODE POINTS EACH REPRESENTING CHARACTER, INDICATING SECOND SOURCE PACKED DATA HAVING PACKED LENGTHS OF VALIDATED VARIABLE LENGTH CODE POINTS FROM FIRST SOURCE PACKED DATA, AND INDICATING DESTINATION STORAGE LOCATION ⸺979

STORE RESULT PACKED DATA IN INDICATED DESTINATION STORAGE LOCATION IN RESPONSE TO PACKED VARIABLE LENGTH CODE POINT CHARACTER BITS EXTRACTION INSTRUCTION, RESULT PACKED DATA HAVING PACKED SETS OF EXTRACTED CHARACTER BITS, EACH SET OF EXTRACTED CHARACTER BITS CORRESPONDING TO DIFFERENT ONE OF VALIDATED VARIABLE LENGTH CODE POINTS FROM FIRST SOURCE PACKED DATA, AND EACH SET OF EXTRACTED CHARACTER BITS SUFFICIENT TO DETERMINE CHARACTER REPRESENTED BY VARIABLE LENGTH CODE POINTS ⸺980

FIG. 9

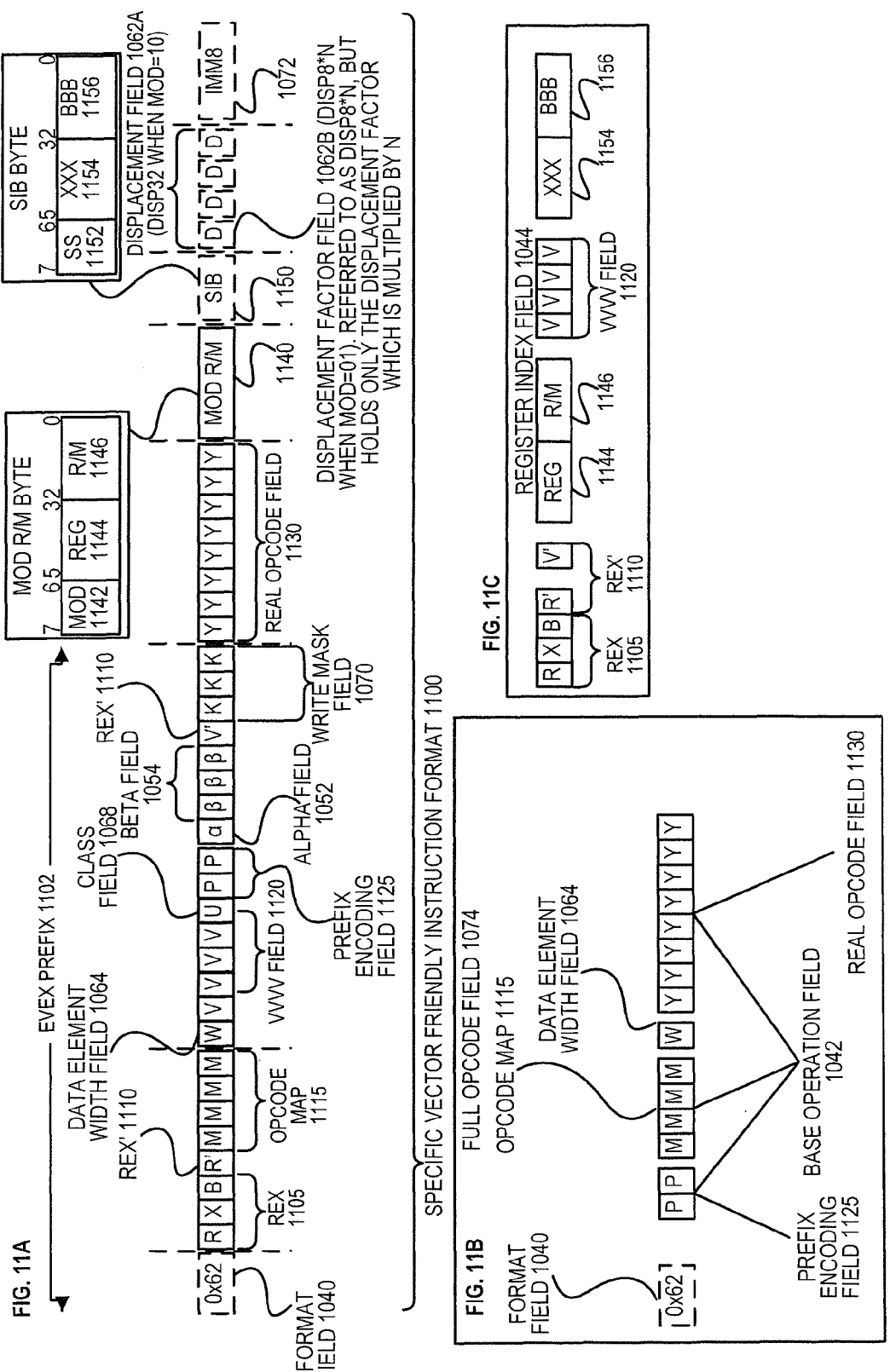

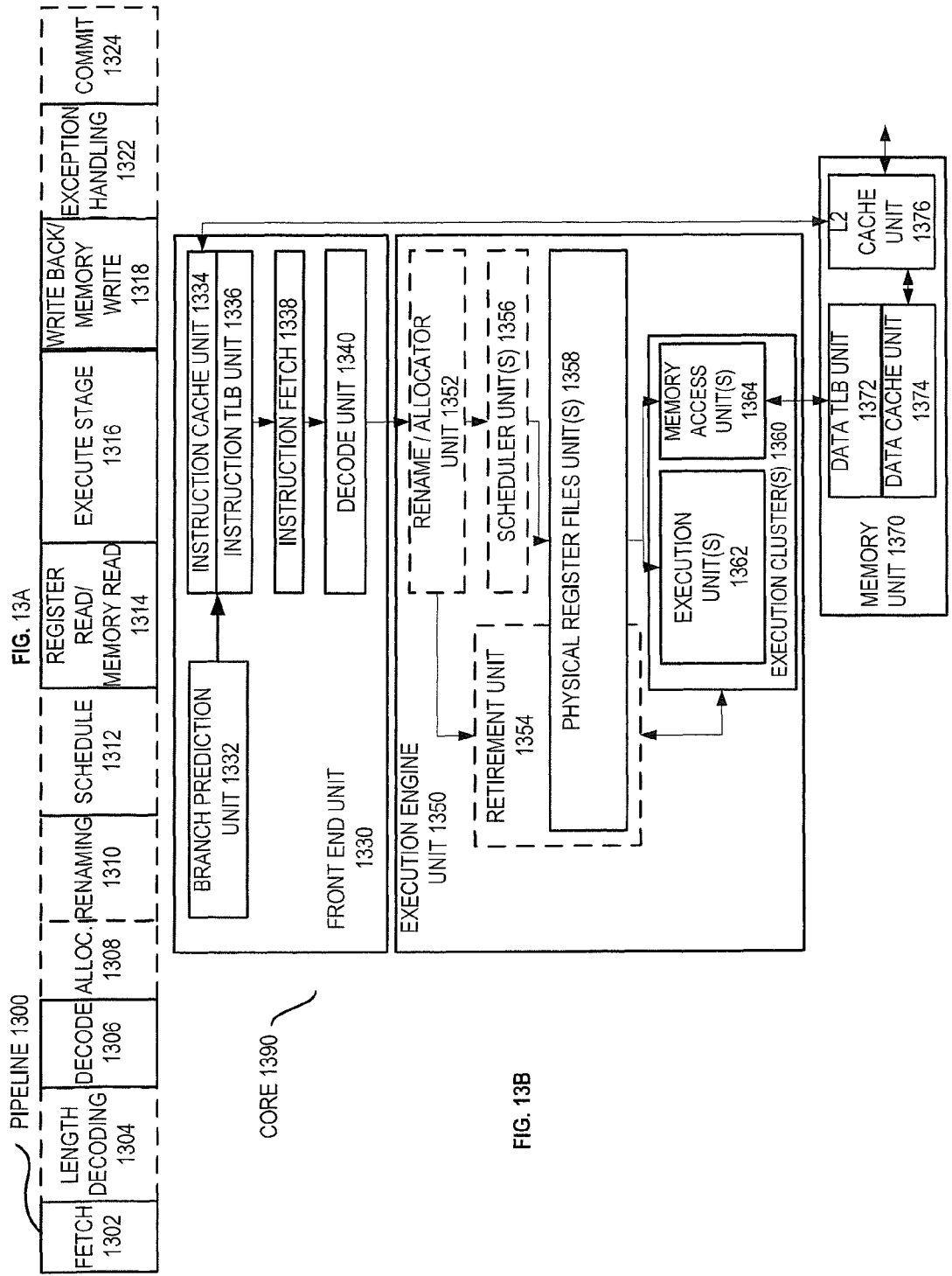

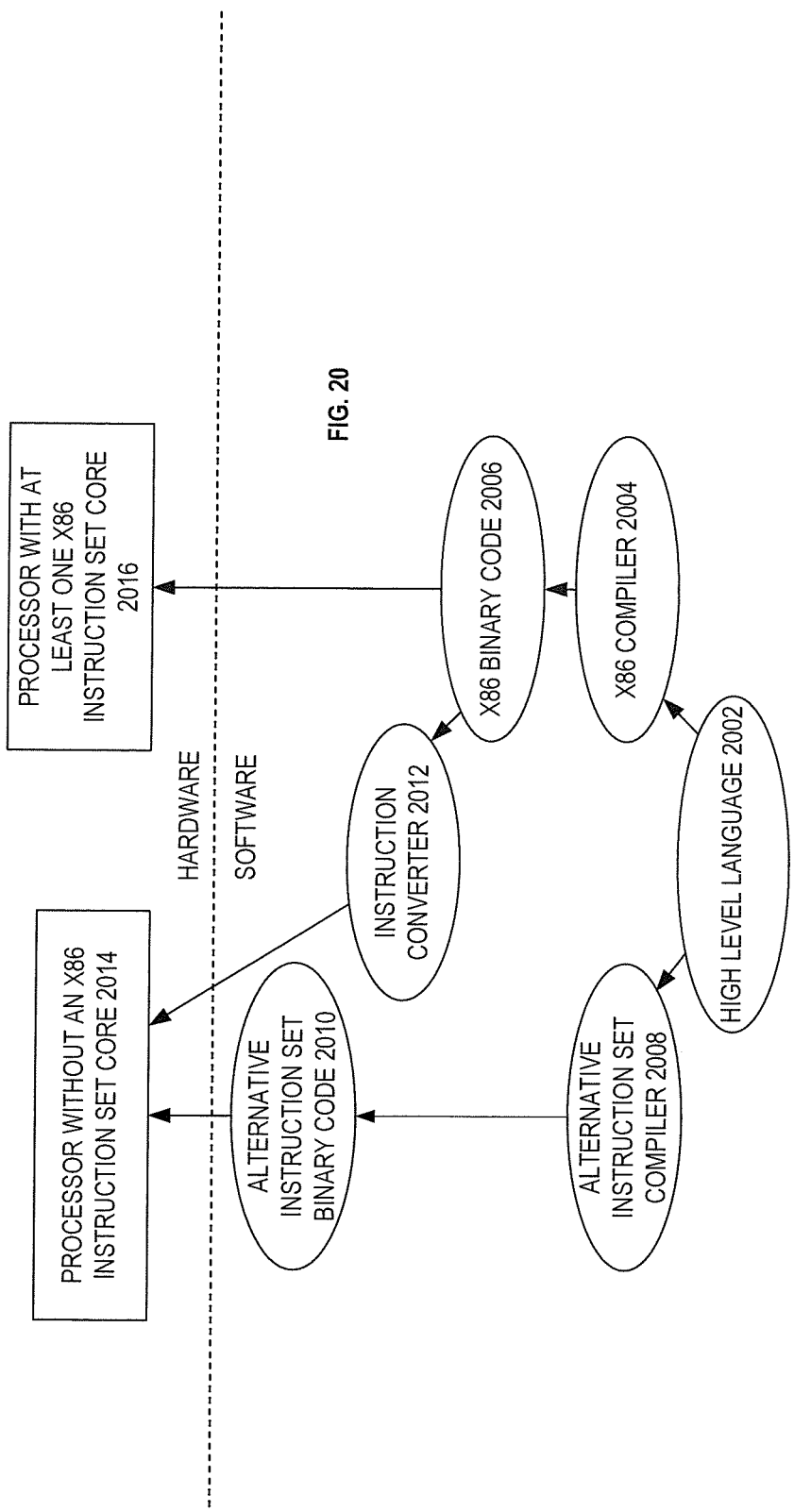

US 9,626,184 B2

PROCESSORS, METHODS, SYSTEMS, AND INSTRUCTIONS TO TRANSCODE VARIABLE LENGTH CODE POINTS OF UNICODE CHARACTERS

BACKGROUND

Technical Field

Embodiments described herein generally relate to processors. In particular, embodiments described herein generally relate to processors having instructions that are useful for transcoding variable length code points of Unicode characters.

Background Information

Computers fundamentally process binary numbers. They generally do not process the various different types of letters, decimal numbers, symbols, or other characters used in the various different languages and traditions. Rather, these different letters, decimal numbers, symbols, and other characters are assigned and represented by binary numbers.

The Universal Character Set (UCS) is a standardized set of characters upon which several character encodings are based. UCS is defined by the International Standard ISO/IEC 10646, Information technology—Universal multiple-octet coded character set (UCS), along with amendments to this standard. The UCS includes a large number of different characters including the letters, numbers, symbols, ideograms, logograms, and other characters from the most prevalent languages, scripts, and traditions of the world. Each of these characters is identified by an integer number that is referred to as that characters code point.

The Unicode Standard (Unicode) has been developed in tandem with USC. Unicode represents a computing industry standard for the consistent digital encoding, representation, and handling of the characters of the UCS. Unicode reportedly provides a unique number for every character, no matter what the platform, no matter what the program, no matter what the language. Unicode is currently used by almost all modern computers and serves as a foundation for processing text on the Internet.

Unicode may be implemented through various different character encodings. One commonly used encoding is UTF-8 (UCS Transformation Format-8-bit). UTF-8 is a variable-length (e.g. variable number of bytes) encoding that can represent every character in Unicode. Each Unicode character is represented with between one and four bytes. The bytes are also referred to as octets in the Unicode standard. UTF-8 uses one byte to represent any of the ASCII characters. UTF-8 is backward-compatible with ASCII and the characters have the same encoding in both ASCII and UTF-8. Other non-ASCII characters are represented by two, three, or four bytes. It is estimated that UTF-8 is the predominant encoding of Unicode in web pages on the world-wide web with more than half of all web pages estimated to be encoded using UTF-8. UTF-8 is also widely used by e-mail programs to display and create mail. Increasingly, UTF-8 is also being used to encode Unicode characters in certain programming languages, operating systems, application programming interfaces (APIs), and software applications.

Another commonly used encoding is UTF-16 (UCS Transformation Format-16-bit). UTF-16 is a variable-length (e.g. variable number of bytes) encoding that can represent every character in Unicode. Each Unicode character is represented with either two or four bytes. UTF-16 is not backward-compatible with ASCII. UTF-16 is commonly used as the internal form of Unicode in certain programming languages, such as, for example, Java, C#, and JavaScript, and in certain operating systems. Various other known encodings are also used (e.g., UTF-2, UTF-32, UTF-1, etc.).

Commonly, in order to facilitate processing within computer systems, UTF-8, UTF-16, or other encoded data, may be transcoded into another format, such as, for example, Unicode. Transcoding represents the direct digital-to-digital data conversion of one encoding to another. Such transcoding may be done for various reasons, such as, for example, to help improve the efficiency or speed of processing the data, to convert the encoded data to a format used by software or a more widely recognized format, etc. Often a large amount of processing is needed to transcode the content of web pages, documents formatted in mark-up languages, XML documents, and the like, from one encoding (e.g., UTF-8) into standard Unicode characters or other formats. Due to the prevalence of such transcoding and/or its potential impact on performance, new and useful approaches for transcoding would offer advantages.

BRIEF DESCRIPTION OF THE DRAWINGS

The invention may best be understood by referring to the following description and accompanying drawings that are used to illustrate embodiments. In the drawings:

FIG. 2 is a table of characteristics of variable length UTF-8 code points.

FIG. 9 is a block flow diagram of an embodiment of a method performed by and/or within a processor when processing an embodiment of a packed variable length code point character bits (e.g., Unicode bits) extraction instruction.

FIG. 11A is a block diagram illustrating an exemplary specific vector friendly instruction format according to embodiments of the invention.

FIG. 11B shows a specific vector friendly instruction format that is specific in the sense that it specifies the location, size, interpretation, and order of the fields, as well as values for some of those fields.

FIG. 11C is a block diagram illustrating the fields of the specific vector friendly instruction format that make up the register index field according to one embodiment of the invention.

FIG. 13A is a block diagram illustrating both an exemplary in-order pipeline and an exemplary register renaming, out-of-order issue/execution pipeline according to embodiments of the invention.

FIG. 13B is a block diagram illustrating both an exemplary embodiment of an in-order architecture core and an exemplary register renaming, out-of-order issue/execution architecture core to be included in a processor according to embodiments of the invention.

FIG. 20 is a block diagram contrasting the use of a software instruction converter to convert binary instructions in a source instruction set to binary instructions in a target instruction set according to embodiments of the invention.

DETAILED DESCRIPTION OF EMBODIMENTS

Disclosed herein are instructions useful to transcode variable length code points of Unicode data, processors to execute or perform the instructions, methods performed by the processors when executing or performing the instructions, and systems incorporating one or more processors to execute or perform the instructions. In the following description, numerous specific details are set forth (e.g., specific instruction operations/functionalities, combinations of instructions, encoding formats, processor configurations, sequences of operations, and the like). However, embodiments may be practiced without these specific details. In other instances, well-known circuits, structures and techniques have not been shown in detail to avoid obscuring the understanding of the description.

Figure 1:
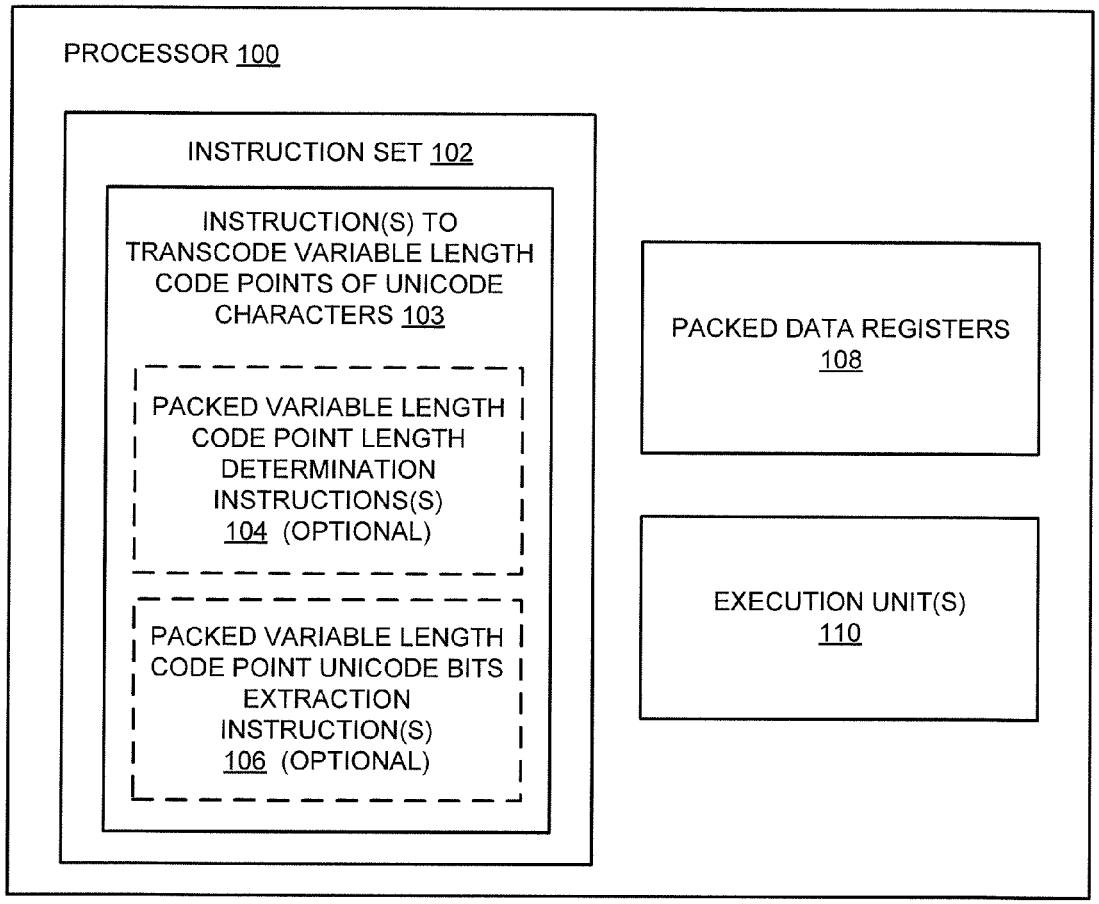
FIG. 1 is a block diagram of an embodiment of a processor.

FIG. 1 is a block diagram of an embodiment of a processor 100. The processor represents an embodiment of an instruction processing apparatus. In some embodiments, the processor may be a general-purpose processor (e.g., a general-purpose microprocessor of the type often used as a central processing unit (CPU) in desktop, laptop, and like computers). Alternatively, the processor may be a special-purpose processor. Examples of suitable special-purpose processors include, but are not limited to, network processors, communications processors, cryptographic processors, graphics processors, co-processors, embedded processors, digital signal processors (DSPs), and controllers (e.g., microcontrollers), to name just a few examples. Such special-purpose processors are also sometimes referred to as hardware accelerators, special-purpose accelerators, or the like. The processor may be any of various complex instruction set computing (CISC) processors, various reduced instruction set computing (RISC) processors, various very long instruction word (VLIW) processors, various hybrids thereof, or other types of processors entirely.

The processor has an instruction set 102. The instructions of the instruction set represent macroinstructions, assembly language instructions, machine-level instructions, or other relatively higher level instructions or control signals, as opposed to microinstructions, micro-ops, or other relatively lower level instructions or control signals which result from decoding the higher-level instructions or control signals. In some embodiments, the instruction set may include one or more instructions 103 that are useful to transcode variable length encodings or code points of Unicode data. In some embodiments, the instructions 103 may optionally include one or more packed variable length code point length determination instructions 104. The packed variable length code point length determination instructions 104 may have any of the characteristics, attributes, or features shown and described further below in FIGS. 3-5. In some embodiments, the instructions 103 may optionally include one or more packed variable length code point character bits (e.g., Unicode bits) extraction instructions 106. The packed variable length code point character bits (e.g., Unicode bits) extraction instructions 106 may have any of the characteristics, attributes, or features shown and described further below in FIGS. 2 and 6-9. In some embodiments, the instructions 103 may optionally include both one or more packed variable length code point length determination instructions 104 and one or more packed variable length code point character bits (e.g., Unicode bits) extraction instructions 106, although this is not required.

The processor also includes a set of packed data registers 108. The packed data registers generally represent on-die or on-processor storage locations. The packed data registers are operable to store packed data, vector data, or SIMD data. Instructions of the instruction set (e.g., the packed variable length code point length determination instructions 104 and/or the packed variable length code point Unicode bits extraction instructions 106), may specify packed data registers of the set 108 to identify operands (e.g., source operands, destination operands, etc.). That is, the packed data registers may be visible to software and/or a programmer (possibly implemented with register renaming). Such registers are sometimes referred to as architecturally-visible registers or architectural registers.

The processor also includes one or more execution units 110. The execution unit(s) are operable to execute or process the optional packed variable length code point length determination instructions 104 and/or the optional packed variable length code point Unicode bits extraction instructions 106. In some embodiments, the execution unit(s) may include particular logic (e.g., particular circuitry or other hardware potentially combined with one or more of firmware and software) to execute the instructions 104, 106.

FIG. 2 is a table of characteristics 224 of variable length UTF-8 code points. A first leftmost column lists the number of bytes in the variable length UTF-8 code points. A first row corresponds to one byte UTF-8 code points, a second row corresponds to two byte UTF-8 code points, a third row corresponds to three byte UTF-8 code points, and a fourth row corresponds to four byte UTF-8 code points. In the future it is possible that five or even six byte UTF-8 code points may become more prevalent in UTF-8.

The second through fourth columns list the format of the bytes of the variable length UTF-8 code points. The format within each byte is shown from least significant bit position on the right to most significant bit position on the left. For example, the format of byte 1 of the one byte UTF-8 code point is 0xxxxxxx. The byte 2 follows byte 1 (i.e., byte 2 is more significant), the byte 3 follows the byte 2, and the byte 4 follows byte 3. For the two byte UTF-8 code point, the format of byte 1 is 110xxxxx and the format of byte 2 is 10xxxxxx. The formats of the three and four byte UTF-8 code points are as shown in the illustration. In these formats, the bits that are binary ones (i.e., 1) and zeroes (i.e., 0) represent signature bits 226, whereas the symbol "x" is used in those bits that represent Unicode code point bits 228. For example, for the two byte UTF-8 format, the leftmost three most significant bits of byte 1 and the leftmost two most significant bits of byte 2 are signature bits, whereas all other bits represented with an "x" are Unicode code point bits.

The signature bits 226 are used to determine the length of the UTF-8 code point (e.g., whether it is a one byte, two byte, three byte, or four byte UTF-8 code point). For example, the signature bits may be used to determine positional context of a code point in an input byte stream may be used to determine the identities of component bytes of a multi-byte UTF-8 code point. The Unicode code point bits 228 may be used to determine, through transcoding, the corresponding Unicode character or value that is encoded or represented by the UTF-8 code point. That is, the Unicode code point bits will vary from one Unicode character to another.

The one byte UTF-8 code point has one signature bit in bit-7 and seven Unicode code point bits in bits [6:0]. The two byte UTF-8 code point has five signature bits in bits [7:5] and [15:14], and eleven Unicode code point bits in bits [4:0] and [13:8]. The three byte UTF-8 code point has eight signature bits in bits [7:4], [15:14], and [23:22], and sixteen Unicode code point bits in bits [3:0], [13:8], and [21:16]. The four byte UTF-8 code point has eleven signature bits in bits [7:3], [15:14], [23:22], and [31:30]. The four byte UTF-8 code point has twenty one Unicode code point bits in bits [2:0], [13:8], [21:16], and [29:24].

Accordingly, UTF-8 as well as other standards used to encode Unicode characters use variable length encodings or code points (e.g., variable numbers of bytes to represent the different Unicode characters). These variable length encodings or code points generally mean that processors need to transcode or otherwise process these code points or streams of bytes with positional context derived from one or more previous byte(s). This feature often makes it difficult to perform this transcoding utilizing packed, vector, or SIMD operations. For one thing, the computational operations or manipulations needed to transcode a UTF-8 code point, for example, into a 32-bit Unicode value, typically varies with the length of the UTF-8 code point. As a result, the demarkation boundaries between the variable length code points (e.g., the one, two, three, and four byte UTF-8 code points) generally need to be determined and respected during the SIMD processing. Existing SIMD instruction sets are generally inefficient at validating or determining the variable lengths of code points in UTF-8 and other variable length encodings. Improved ways of determining the lengths of the different code points, for example through single instructions specially designed for this purpose, may offer advantages. Additionally, the inter-byte and intra-byte bit granular processing with non-stationary patterns from one byte to the next involved in the transcoding of the UTF-8 or other variable length code points into other formats generally tend to be difficult to implement in packed, vector, or SIMD operations. Improved ways of performing such heterogeneous inter-byte and intra-byte processing involved during transcoding, for example through single instructions specially designed for this purpose, may offer advantages.

Figure 3:
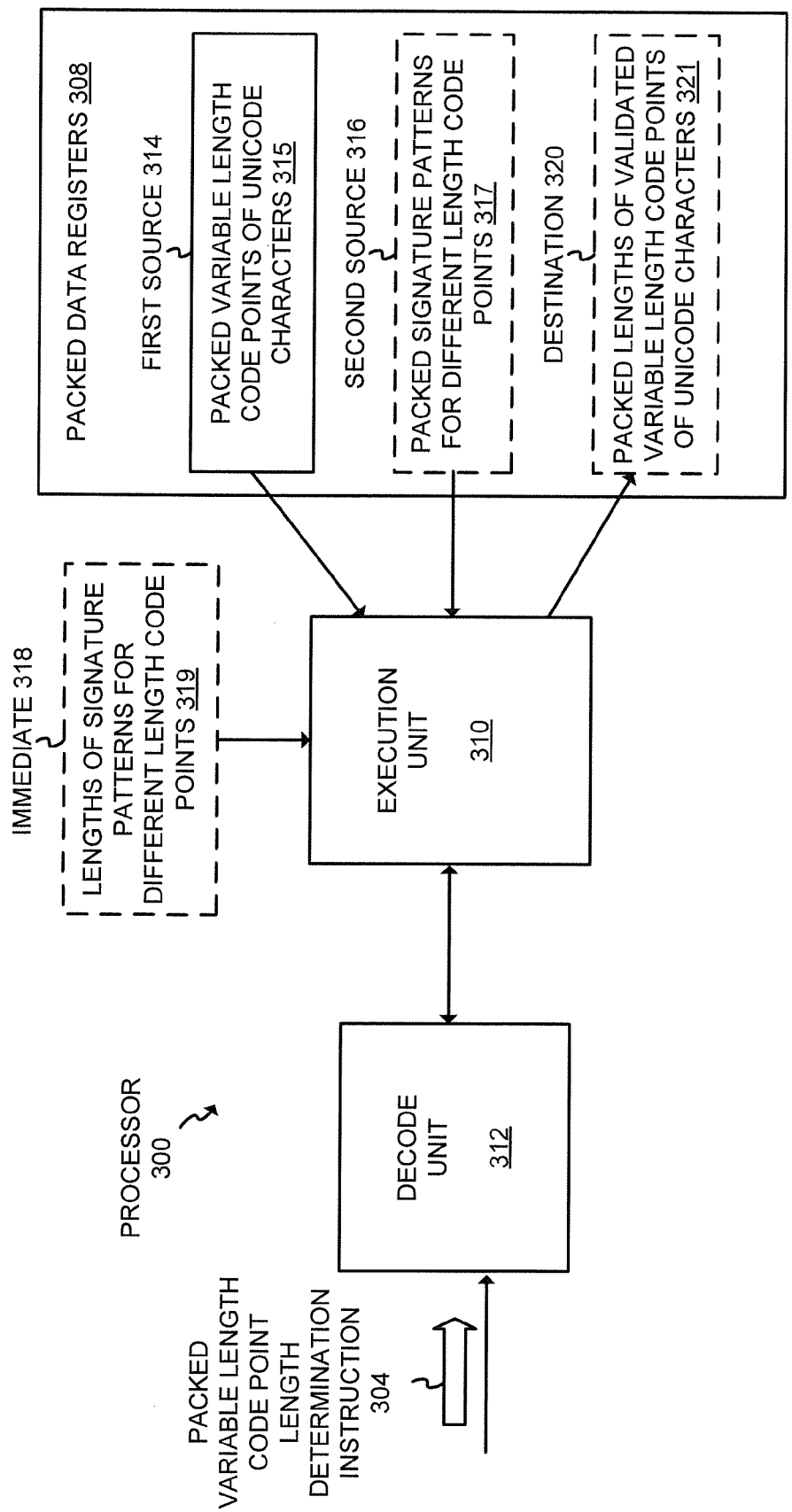
FIG. 3 is a block diagram of an embodiment of a processor that is operable to process an embodiment of a packed variable length code point length determination instruction.

FIG. 3 is a block diagram of an embodiment of a processor 300 that is operable to execute or process an embodiment of a packed variable length code point length determination instruction 304. The processor 300 may optionally have any of the characteristics or attributes of the processor of FIG. 1. For example, the processor 300 may be a general-purpose processor, a special-purpose processor, may have a CISC, RISC, VLIW or other architecture, etc. To avoid obscuring the description, these features which may be the same or similar will not be repeated, but rather the discussion will tend to emphasize the different or additional features of the processor of FIG. 3.

The processor 300 may receive the packed variable length code point length determination instruction 304. For example, the instruction may be received from an instruction fetch unit, an instruction queue, or the like. The instruction may represent a macroinstruction, machine code instruction, assembly language instruction, or other instruction or control signal of an instruction set of the processor. The instruction may have an operation code or opcode. The opcode may represent a plurality of bits or one or more fields that are operable to identify the instruction and/or the operation to be performed (e.g., a packed variable length code point length determination operation). The instruction may also have bits or one or more fields to specify one or more source and/or destination operands, as will be explained further below.

The illustrated processor includes an instruction decode unit 312. The instruction decode unit may also be referred to as a decode unit or a decoder. The decode unit may receive and decode relatively higher-level instructions or control signals (e.g., macroinstructions, machine code instructions, assembly language instructions, etc.) and output one or more microinstructions, micro-operations, micro-code entry points, or other relatively lower-level instructions or control signals that reflect, represent, and/or are derived from the higher-level instructions or control signals. The one or more lower-level instructions or control signals may implement the higher-level instruction or control signal through one or more lower-level (e.g., circuit-level or hardware-level) operations. The decode unit may be implemented using various different mechanisms, logic, or integrated circuitry including, but not limited to, microcode read only memories (ROMs), look-up tables, hardware implementations, programmable logic arrays (PLAs), and other mechanisms, logic, or integrated circuitry used to implement decode units known in the art.

In other embodiments, an instruction emulator, translator, morpher, interpreter, or other instruction conversion logic may be used. Various different types of instruction conversion logic are known in the arts and may be implemented in software, hardware, firmware, or a combination thereof. The instruction conversion logic may receive the instruction and emulate, translate, morph, interpret, or otherwise convert the instruction into one or more corresponding derived instructions or control signals. In other embodiments, both instruction conversion logic and a decode unit may be used. For example, the processor may have instruction conversion logic to convert a received machine code instruction into one or more intermediate instructions, and a decode unit to decode the one or more intermediate instructions into one or more lower-level instructions or control signals executable by native hardware of the processor (e.g., an execution unit). Some or all of the instruction conversion logic may be located outside the processor, such as, for example, on a separate die and/or in a memory.

The processor 300 also includes a set of packed data registers 308. Each of the packed data registers may represent an on-die storage location that is operable to store packed data, vector data, or SIMD data. The packed data registers may be implemented in different ways in different microarchitectures using well-known techniques and are not limited to any particular type of circuit. Various different types of registers are suitable. Examples of suitable types of registers include, but are not limited to, dedicated physical registers, dynamically allocated physical registers using register renaming, and combinations thereof.

Referring again to FIG. 3, the execution unit 310 is coupled with the decode unit 312 and with the packed data registers 308. By way of example, the execution unit may include a functional unit, a logic unit, an arithmetic logic unit, a digital circuit to perform logical and/or arithmetic and logical operations, or the like. The execution unit may receive one or more decoded or otherwise converted instructions or control signals that represent and/or are derived from the packed variable length code point length determination instruction 304. The execution unit and/or the processor may include specific or particular logic (e.g., circuitry or other hardware potentially combined with firmware and/or software) that is operable to perform a packed variable length code point length determination operation in response to and/or as a result of the packed variable length code point length determination instruction (e.g., in response to one or more instructions or control signals decoded or otherwise derived therefrom).

In some embodiments, the packed variable length code point length determination instruction 304 may explicitly specify (e.g., through one or more fields or a set of bits), or otherwise indicate (e.g., implicitly indicate), a first source packed data 314. The first source packed data may have at least two packed variable length code points of Unicode characters 315. In one particular embodiment, the first source packed data may have a portion of a stream of contiguous variable UTF-8 codes points or encodings for Unicode characters including one byte, two byte, optionally three byte, and optionally four byte code points, although the scope of the invention is not so limited.

In some embodiments, the packed variable length code point length determination instruction may optionally explicitly specify or otherwise indicate a second source packed data 316, although this is not required. The second source packed data may have at least two packed signature patterns for different variable length code points. Alternatively, instead of the instruction needing to indicate the second source packed data having the two or more packed signature patterns, the two or more signature patterns may optionally be stored in an on-die non-volatile memory, such as, for example, an on-die read only memory (ROM). In some embodiments, there may be a different signature pattern for each different possible length code point in the first source packed data 314. In some embodiments, there may be at least two, optionally three, or optionally four or more different signature patterns, depending upon the particular encoding approach, and each corresponding to a different variable length code point possible in the first source packed data 314. These signature patterns may be substantially predetermined or fixed values.

In one particular example embodiment utilizing UTF-8, there may be a one byte UTF-8 signature pattern for a one byte UTF-8 code point, a two byte UTF-8 signature pattern for a two byte UTF-8 code point, optionally a three byte UTF-8 signature pattern for a three byte UTF-8 code point, and optionally a four byte UTF-8 signature pattern for a four byte UTF-8 code point, although the scope of the invention is not so limited. The patterns of the signature bits may optionally be similar to those shown and described above for FIG. 2. For example, a signature pattern for a one byte UTF-8 code point may have one signature bit in bit-7, a signature pattern for a two byte UTF-8 code point may have five signature bits in bits [7:5] and [15:14], a signature pattern for a three byte UTF-8 code point may have eight signature bits in bits [7:4], [15:14], and [23:22], and a signature pattern for a four byte UTF-8 code point may have eleven signature bits in bits [7:3], [15:14], [23:22], and [31:30].

Table 1 below lists examples of suitable signature patterns represented in binary and hexadecimal notations for one to four byte UTF-8 code points.

TABLE 1

Signature patterns for UTF-8 Code Points

| Bytes of UTF-8 Code Point | Signature Pattern in Binary (in byte order i.e. byte 1, byte 2, byte 3, byte 4) | Signature Pattern in Hexadecimal |
| --- | --- | --- |
| 1 | 00000000 | 0x00 |
| 2 | 11000000 10000000 | 0x80C0 |
| 3 | 11100000 10000000 10000000 | 0x8080E0 |
| 4 | 11110000 10000000 10000000 10000000 | 0x808080F0 |

In some embodiments, the packed variable length code point length determination instruction 304 may optionally have an immediate 318, although this is not required. The immediate may have lengths of the signature patterns for the different variable length code points (e.g., that are in the second source packed data 316). Each of the lengths may correspond to a different one of the signature patterns. For example, the lengths may include or indicate a one byte length corresponding to a one byte signature pattern, a two byte length corresponding to a two byte signature pattern, optionally a three byte length corresponding to a three byte signature pattern, and optionally a four byte length corresponding to a four byte signature pattern. In other embodiments, only two, or only three different lengths may be needed for the particular implementation. Alternatively, in other embodiments, instead of the instruction needing to have the immediate, the lengths of the signature patterns may optionally be provided otherwise, such as, for example, being stored in an on-die ROM or other on-die non-volatile memory. As another option, the lengths may optionally be provided by another explicitly specified or implicitly indicated source operand (e.g., provided through an implicit register).

In some embodiments, the packed variable length code point length determination instruction may optionally explicitly specify or otherwise indicate a destination 320 (e.g., a destination storage location) where a result packed data is to be stored in response to the instruction 304. In some embodiments, the result packed data may include packed lengths of validated variable length code points or encodings of Unicode characters 321.

In some embodiments, the execution unit may determine whether a piece of data from the packed variable length code points of the Unicode characters 315 matches any of the different signature patterns for the different length code points 317. For example, the execution unit may compare the first byte from the packed variable length UTF-8 code points of the Unicode characters 315 with a one byte UTF-8 signature pattern 317, may compare the first two bytes from the packed variable length UTF-8 code points of the Unicode characters 315 with a two byte UTF-8 signature pattern 317. In some embodiments, the execution unit may also optionally compare the first three bytes from the packed variable length UTF-8 code points of the Unicode characters 315 with a three byte UTF-8 signature pattern 317, and may further optionally compare the first four bytes from the packed variable length UTF-8 code points of the Unicode characters 315 with a four byte UTF-8 signature pattern 317.

If at some point there is a match, then it may be inferred that the length of the variable length UTF-8 or other variable length code point from the first source data 314 has been properly determined. This is sometimes referred to in the arts as validating a code point. In some embodiments, the execution unit may then store the validated or otherwise determined length for that variable length UTF-8 or other code point in a corresponding position in the destination 320. For example, the first contiguous three byte segment from the first source 314 matches a three byte signature pattern from the second source 316, then a value of three may be stored or otherwise indicated in a corresponding position in the destination to indicate that the corresponding code point is a three byte code point. This process may be repeated to generate a result that includes packed lengths of all validated variable length code points of Unicode characters 321 that are able to be validated or otherwise determined in the first source 314.

As shown, in some embodiments, each of the first source packed data 314, the second source packed data 316, and the destination 320 may represent a different packed data register. Alternatively, memory locations, or other storage locations, may be used for one or more of these operands. For example, the packed variable length code points of Unicode characters 315 may instead be stored in a memory location. Moreover, one or more of the sources and/or destination operands may be implicit to the instruction instead of being explicitly specified. As another option, one of the source operands may optionally be reused as the destination operand and the result packed data may be written over the source packed data. Although in some cases it may be desirable to preserve the source packed data.

To avoid obscuring the description, a relatively simple processor 300 has been shown and described. In other embodiments, the processor may optionally include other well-known components found in processors. Examples of such components include, but are not limited to, a branch prediction unit, an instruction fetch unit, instruction and data caches, instruction and data translation lookaside buffers, prefetch buffers, microinstruction queues, microinstruction sequencers, a register renaming unit, an instruction scheduling unit, bus interface units, second or higher level caches, a retirement unit, other components included in processors, and various combinations thereof. There are literally numerous different combinations and configurations of components in processors, and embodiments are not limited to any particular combination or configuration. Embodiments may be included in processors have multiple cores, logical processors, or execution engines at least one of which has execution logic operable to execute an embodiment of an instruction disclosed herein.

Figure 4:
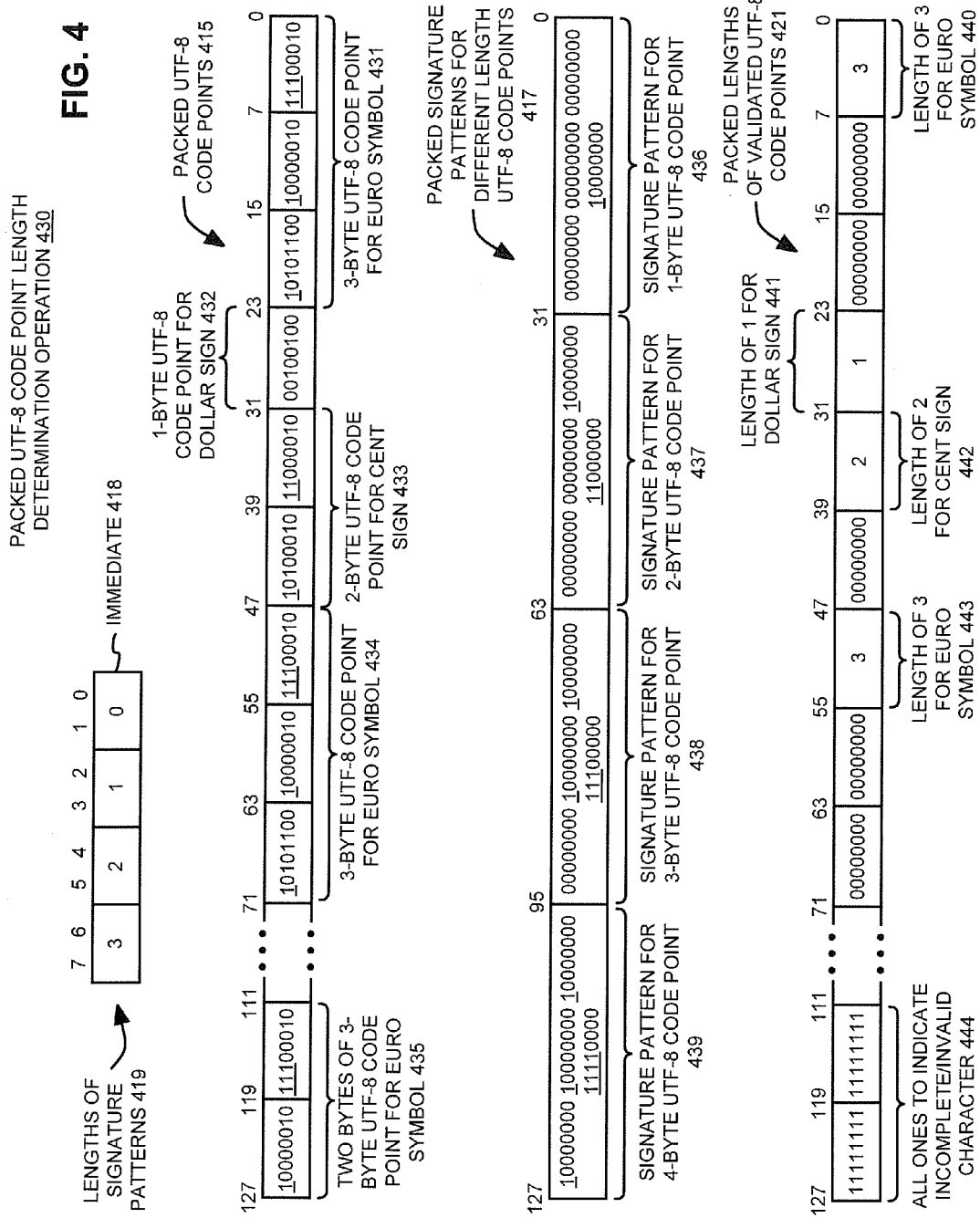
FIG. 4 is a block diagram of an example embodiment of a suitable packed variable length code point length determination operation for variable length UTF-8 code points.

FIG. 4 is a block diagram of an example embodiment of a suitable packed variable length code point length determination operation 430 for variable length UTF-8 code points. The operation may be performed by a processor or other instruction processing apparatus in response to and/or as a result of an embodiment of a packed variable length code point length determination instruction.

The instruction may specify or otherwise indicate packed UTF-8 code points 415. For example, the packed UTF-8 code points may be in a packed data register or memory location specified or otherwise indicated by the instruction. In the illustrated embodiment, the packed UTF-8 code points is 128-bits wide. In other embodiments, other widths may optionally be used, such as, for example, 64-bits, 256-bits, 1024-bits, or some other width. The 128-bits is wide enough to accommodate sixteen bytes. The sixteen bytes are able to store a variable number of variable length UTF-8 code points, for example, each having from one to four bytes. In the illustrated example, the lowest order three bytes in bits [23:0] store a 3-byte UTF-8 code point 431 for the Euro currency symbol (€). The fourth byte in bits [31:24] stores a 1-byte UTF-8 code point 432 for the dollar sign ($). The fifth and sixth bytes in bits [47:32] store a 2-byte UTF-8 code point 433 for the cent sign (¢). The seventh to ninth bytes in bits [71:48] also store a 3-byte UTF-8 code point 434 for the Euro currency symbol. The fifteen and sixteenth bytes in bits [127:112] store an incomplete two of the three bytes of the 3-byte UTF-8 code point 435 for the Euro currency symbol. The remaining third byte is not able to fit within the width limits of the 128-bit packed data operand and so only an incomplete portion of the symbol is present (e.g. in the 128-bit register).

The instruction may specify or otherwise indicate packed signature patterns for different length UTF-8 code points 417. In some embodiments, the instruction may specify a register or other storage location having the packed signature patterns. In other embodiments, the packed signature patterns may be stored in a ROM or other on-die non-volatile memory. In the illustrated embodiment, four different signature patterns are shown. In particular, a first signature pattern 436 for a one byte UTF-8 code point is stored in a lowest order 32-bit doubleword in bits [31:0], a second signature pattern 437 for a two byte UTF-8 code point is stored in a next to lowest order 32-bit doubleword in bits [63:32], a third signature pattern 438 for a three byte UTF-8 code point is stored in a next to highest order 32-bit doubleword in bits [95:64], a fourth signature pattern 439 for a four byte UTF-8 code point is stored in a highest order 32-bit doubleword in bits [127:96]. The first signature pattern may be zero extended and may have in its lowest order byte the values "00000000". The second signature pattern may be zero extended and may have in its lowest order two bytes the values "10000000 11000000". The third signature pattern may be zero extended and may have in its lowest order three bytes the values "10000000 10000000 11100000". The fourth signature pattern may be zero extended and may have in its lowest order four bytes the values "10000000 10000000 10000000 11110000". These signature patterns may also optionally be arranged in any other order within the operands. Also in other embodiments as few as two different signature patterns may be used (e.g., if only one and two byte UTF-8 code points are going to be used but not three or four byte UTF-8 code points). Notice that the set bits (i.e., binary ones) in the signature patterns 417 are also found in the same relative bit positions of the UTF-8 code points 415 for the same byte length. For example, the signature pattern for the two byte UTF-8 code point 437 has set bits in only bits [15:14] and [7], and the two byte UTF-8 code point for the cent sign 433 also has set bits in bits [15:14] and [7].

In some embodiments, the instruction may specify or otherwise indicate lengths of the signature patterns 419. In this embodiment, the lengths of the signature patterns are one, two, three, and four bytes. In some embodiments, the instruction may have an immediate to provide these lengths. For example, in one embodiment, the immediate may be an 8-bit immediate having four 2-bit fields to each indicate one of the lengths. In some embodiments, a so-called "plus one" convention may be used in which a value of zero in the immediate may be used to indicate 1-byte, a value of one may be used to indicate 2-bytes, a value of two may be used to indicate 3-bytes, and a value of three may be used to indicate 4-bytes, although this is not required. These values may also optionally be arranged in any other orders within the immediate as long as each logically corresponds to the respective signature pattern. In another embodiment, two different lengths may be indicated by two 2-bit fields of a 4-bit immediate. In other embodiments, the lengths may optionally be stored in a ROM or other on-die non-volatile memory instead of being provided by the immediate.

In response to and/or as a result of the instruction, the processor may compare bytes from the packed UTF-8 code points 415 with the different packed signature patterns for the different length UTF-8 code points 417. For example, the first byte in bits [7:0] of the packed UTF-8 code points 415 may be compared with the signature pattern 436 for the 1-byte UTF-8 code point and it may be determined that they do not match. Then, the first 2-bytes in bits [15:0] of the packed UTF-8 code points 415 may be compared with the signature pattern 437 for the 2-byte UTF-8 code point and it may be determined that they do not match. Then, the first 3-bytes in bits [23:0] of the packed UTF-8 code points 415 may be compared with the signature pattern 438 for the 3-byte UTF-8 code point and it may be determined that they do not match. In other words, it may be determined that all set bits (i.e., binary one) in the signature pattern 438 are also set bits (i.e., binary one) in the 3-byte UTF-8 code point 431. It may also be determined that bits [31:24] of the packed UTF-8 code points 415 representing a 1-byte UTF-8 code point for the dollar sign 432 match the signature pattern 436 for 1-byte UTF-8 code point. It may also be determined that bits [47-32] of the packed UTF-8 code points 415 representing a 2-byte UTF-8 code point for the cent sign 433 match the signature pattern 437 for 2-byte UTF-8 code point. It may also be determined that bits [71:48] of the packed UTF-8 code points 415 representing a 3-byte UTF-8 code point for the Euro currency sign 434 match the signature pattern 438 for 3-byte UTF-8 code point. The description above describes a particular order for performing these comparisons, although it is to be appreciated that the comparisons may optionally be performed in any other desired order and that the comparisons may be performed serially, in parallel, or partly serially and partly parallel.

Such determinations that the UTF-8 code points match the signature patterns represent an embodiment of determining the lengths of the UTF-8 code points. Values representing the lengths of the UTF-8 code points may be stored in packed lengths of validated UTF-8 code points 421. For example, as shown, this may include storing a value indicating a length of 3-bytes 440 corresponding to the 3-byte UTF-8 code point 431 for the first occurrence of the Euro symbol, a value indicating a length of 1-byte 441 corresponding to the 1-byte UTF-8 code point 432 for the dollar sign, a value indicating a length of 2-bytes 442 corresponding to the 2-byte UTF-8 code point 433 for the cent symbol, and a value indicating a length of 3-bytes 443 corresponding to the 3-byte UTF-8 code point 434 for the second occurrence of the Euro currency symbol. As shown, in some embodiments, the values representing the lengths may optionally be stored in the same relative byte positions of the lowest order bytes of the corresponding UTF-8 code points, and all zeros may optionally be stored in the same relative byte positions of any more significant bytes of the corresponding UTF-8 code points, although this is not required. In other embodiments, other conventions may optionally be used. Advantageously, this format tends to be well suited for variable length encodings. If relatively more smaller code points (e.g., 1-byte code points) are included in the input stream (i.e., the first source) then more lengths may be stored in the destination. For example, up to sixteen lengths of sixteen corresponding 1-byte characters (e.g., UTF-8 code points for ASCII characters) may be stored in the destination.

In FIG. 4 a particular order of the arrangement of the bytes of the UTF-8 code points has been shown and described. However, other ways of organizing or arranging the bytes in the operands or registers are also possible. Any known conventional ways of arranging the bytes of UTF-8 code points are suitable.

Figure 5:
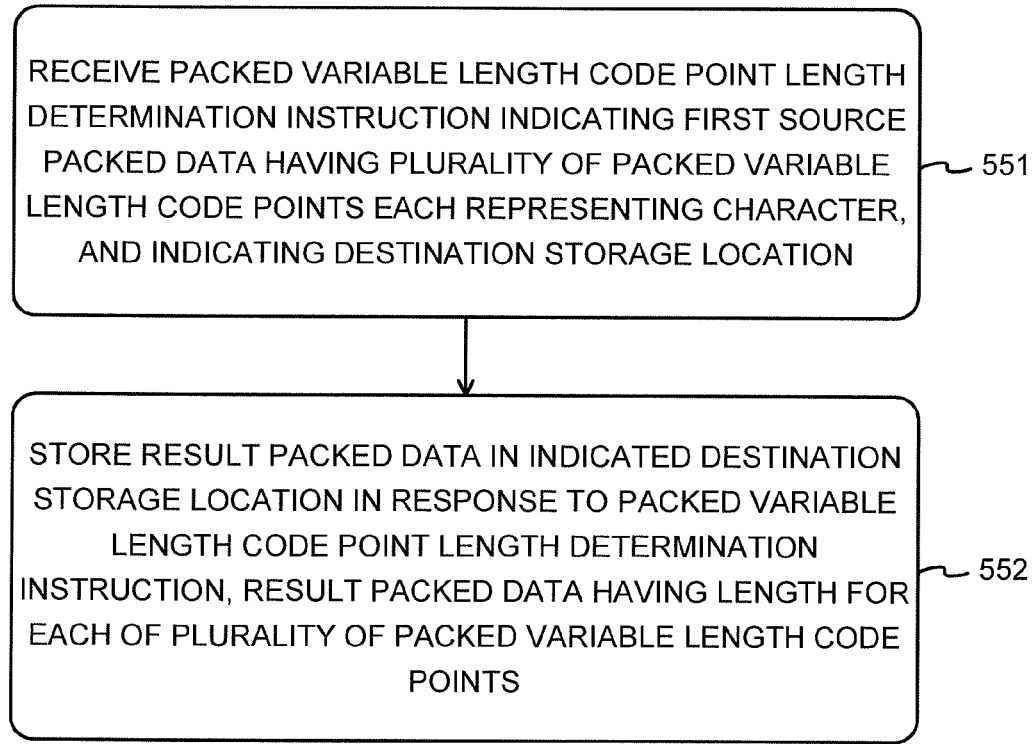
FIG. 5 is a block flow diagram of an embodiment of a method performed by and/or within a processor when processing an embodiment of a packed variable length code point length determination instruction.

FIG. 5 is a block flow diagram of an embodiment of a method 550 performed by and/or within a processor when processing an embodiment of a packed variable length code point length determination instruction. In some embodiments, the operations and/or method of FIG. 5 may be performed by and/or within the processors of FIG. 1 and/or FIG. 3. The components, features, and specific optional details described herein for the processors of FIG. 1 and/or FIG. 3 also optionally apply to the operations and/or method of FIG. 5, which in embodiments may be performed by and/or within such processors. Alternatively, the operations and/or method of FIG. 5 may be performed by and/or within similar or different processors or other apparatus. Moreover, the processors of FIG. 1 and/or FIG. 3 may perform operations and/or methods that are the same as, similar to, or different than those of FIG. 5.

The method includes receiving a packed variable length code point length determination instruction, at block 551. In various aspects, the instruction may be received at a processor or a portion thereof (e.g., an instruction fetch unit, a decode unit, etc.). In various aspects, the instruction may be received from an off-die source (e.g., from a main memory, a disc, or interconnect), or from an on-die source (e.g., from an instruction cache). In some embodiments, the packed variable length code point length determination instruction may explicitly specify or otherwise indicate a first source packed data having a plurality of packed variable length code points each representing a character, and may explicitly specify or otherwise indicate a destination storage location.

A result packed data may be stored in the indicated destination storage location in response to and/or as a result of the packed variable length code point length determination instruction, at block 552. In some embodiments, the result packed data may include a length for each of the plurality of packed variable length code points. In some embodiments, the result packed data may have any of the previously described characteristics of the packed lengths 321 of FIG. 3 and/or the packed lengths 421 of FIG. 4.

To further illustrate certain concepts, consider a detailed example embodiment of a packed variable length code point length determination instruction with the pneumonic VPV-LNCPCLSFL. The format of the instruction may be VPV-LNCPCLSFL DEST, SRC1, SRC2, IMM8. DEST may represent a 128-bit wide destination packed data register. SRC1 may represent a first source 128-bit wide packed data register or memory location. SRC2 may represent a second source 128-bit wide packed data register. IMM8 may represent an 8-bit immediate.

SRC1 may store a chunk of a UTF-8 stream representing a UTF-8 encoded byte sequence. SRC2 may store up to four different signature patterns corresponding to the UTF-8 encoding format for each of up to four different lengths of UTF-8 code points (e.g., one, two, three, and four bytes). For example, each of these four different signature patterns may be stored in a different 32-bit doubleword data elements. IMM8 may include four 2-bit fields. Each 2-bit field may represent the length encoding of a corresponding signature pattern, for example, in a "one plus" convention in which one is added to the length encoded to determine the actual byte length. Another embodiment of the above described instruction may omit the second source operand SRC2 and the immediate IMM8, and instead provide the signature patterns, and their corresponding lengths, through a ROM or other on-die non-volatile memory.

The instruction may be used to validate and determine the byte length of each validated UTF-8 code point from SRC1 and also identify the offset of the first incomplete UTF-8 code point in SRC1. This offset may be useful to determine the beginning of the next UTF-8 chunk to process (e.g., with a subsequent instruction). Each code point from SRC1 may be compared against at least two and up to four different signature patterns corresponding to different lengths from SRC2. If a code point from SRC1 matches a signature pattern from SRC2 then the leading byte position of DEST may store the determined length of the code point, which is equal to the signature pattern length and known from IMM8 (e.g., one, two, three, or four). If the determined length of the code point is greater than one, all zeros (e.g., 00000000) may be filled in each of the following remaining bytes of the code point in DEST.

In some embodiments, if none of the four signature patterns in SRC2 match a code point in SRC1, then the corresponding leading byte of the code point in DEST may optionally be written with all ones (e.g., 11111111). This is optional but may help to mark or indicate invalid or un-validated code points. This may also help to identify the offset of the first incomplete and/or invalid UTF-8 code point in SRC1 (e.g., to be processed by a subsequent instruction). For example, in Intel Architecture (IA) processors, such identification may be accomplished with the use of a PMOVMSKB instruction. For example, the result of PMOVMSKB may be examined and the least significant set bit of the result of PMOVMSKB may indicate the offset of the first incomplete and/or invalid UTF-8 code point in SRC1. If the result of PMOVMSKB performed on DEST is zero, then all 16 bytes of the input UTF-8 stream may be regarded as valid code points. Alternatively, some other suitable recognized value besides all ones (e.g., 11111111) may optionally be stored in DEST under such situations. In other embodiments, either wider or narrower registers may optionally be used. For example, in various embodiments, 64-bit, 256-bit, 512-bit, or 1024-bit registers may be used for SRC1 and/or SRC2 and/or DEST.

The following pseudocode represents another example embodiment of a suitable packed variable length code point length determination instruction. In this pseudocode, Src1 represents a first source having a chunk or sequence of UTF-8 code points, Src2 represents a second source operand having four signatures for one to four byte UTF-8 code points, 1 mm represents an 8-bit immediate, and Dest represents a destination. ZeroExt32 represents a zero extend to 32-bits function.

```
For I = 0, 3
    KLen_i ← Imm[ 1+2*i:2*i] +1; // 1+plus length encoding of i'th
    mask element
    dwMask[i] ← ZeroExt32(Src2[32*i + Klen_i*8 : 32*i]);
EndFor
m = 0; // start from the first byte of 1st source, UTF-8 chunk
tmpFound ← False;
While (tmpFound == False and m < 16 )
    i ← 0;
    // test current code point matches with a UTF-8 mask signature
    pattern
    while (KLen_i > 0 and i <= 3)
        tmpFound ← UTF8_validate_op(dwMask[i], KLen_i,
        ZeroExt32(Src1_bytes[m +Klen_i −1: m]));
        if tmpFound == TRUE then Goto NextCodePoint
        i ← i + 1;
    Wend
    Dest[m*8+7 : m*8] ← 0xff;
    Goto Finish
    NextCodePoint:
    Dest[m*8+7 : m*8] ← KLen_i;
    For n = 1 to KLen_i −1
        Dest[(m+n)*8+7 : (m+n)*8] ← 0;
    EndFor
    m ← m +KLen_i; // point to next UTF-8 code point to perform
    UTF_validate_op
Wend
Finish:
// The following table describes the details of the signature
// UTF_validate_op and signature masks to identify UTF-8 code points:
```

| UTF-8 Length | Signature Length Encoding | Signature Pattern (dwMask) | UTF8_validate Op |
|---|---|---|---|
| 1-byte | 0 | 0x00 | ! ((dwMask XOR Src1) AND 0x80) |
| 2-byte | 1 | 0x80C0 | ! ((dwMask XOR Src1) AND 0xC0E0) |
| 3-byte | 2 | 0x8080E0 | !((dwMask XOR Src1) AND 0xC0C0F0) |
| 4--byte | 3 | 0x808080F0 | !(dwMask XOR Src1) AND 0xC0C0C0F8) |

Figure 6:
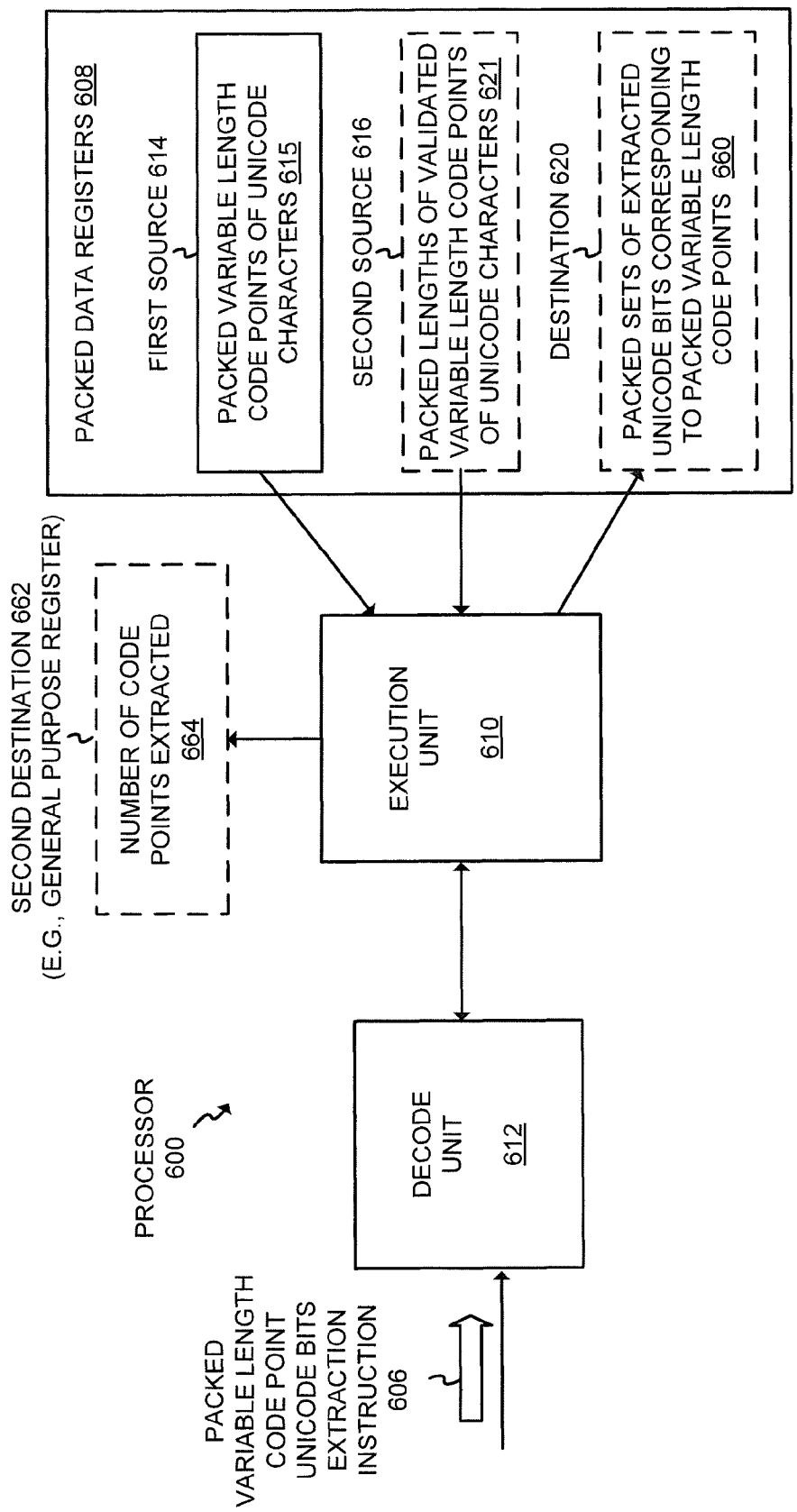
FIG. 6 is a block diagram of an embodiment of a processor that is operable to execute or process an embodiment of a packed variable length code point character bits (e.g., Unicode bits) extraction instruction.

FIG. 6 is a block diagram of an embodiment of a processor 600 that is operable to execute or process an embodiment of a packed variable length code point character bits (e.g., Unicode bits) extraction instruction 606. The processor 600 may optionally have any of the characteristics or attributes of the processor 100 of FIG. 1 and/or the processor 300 of FIG. 3. For example, the processor 600 may be a general-purpose processor, a special-purpose processor, may have a CISC, RISC, VLIW or other architecture, the decode unit may the same or similar, etc. To avoid obscuring the description, these features which may be the same or similar will not be repeated, but rather the discussion will tend to emphasize the different or additional features of the processor 600 of FIG. 6.

The processor 600 may receive the packed variable length code point character bits (e.g., Unicode bits) extraction instruction 606. The Unicode bits to be extracted represent those bits of the variable length encoding that contribute to the Unicode character or value (e.g., the Unicode character may be determined based only on the complete set of Unicode bits to be extracted). The Unicode bits represent an embodiment of character or data bits to be extracted, and other embodiments are not limited to Unicode bits. The instruction may have an operation code or opcode that is operable to identify the instruction and/or the operation to be performed (e.g., a packed variable length code point Unicode bits extraction operation). The illustrated processor includes an instruction decode unit 612 that may be similar to or the same as the decode unit 312. As described previously, instruction conversion logic may also optionally be used. The processor 600 also includes a set of packed data registers 608, which may be similar to or the same as the packed data registers 308. An execution unit 610 is coupled with the decode unit 312 and with the packed data registers 308. The execution unit 610 may be similar to or the same as the execution unit 310. The execution unit and/or the processor may include specific or particular logic (e.g., circuitry or other hardware potentially combined with firmware and/or software) that is operable to perform a packed variable length code point Unicode bits extraction operation in response to and/or as a result of the instruction 606 (e.g., in response to one or more instructions or control signals decoded or otherwise derived from the instruction 606).

In some embodiments, the packed variable length code point character bits (e.g., Unicode bits) extraction instruction 304 may explicitly specify (e.g., through one or more fields or a set of bits), or otherwise indicate (e.g., implicitly indicate), a first source packed data 614. The first source packed data may have at least two packed variable length code points of Unicode characters 615. In one particular embodiment, the first source packed data may have a portion of a stream of contiguous variable UTF-8 codes points or encodings for Unicode characters including one byte, two byte, optionally three byte, and optionally four byte code points, although the scope of the invention is not so limited. In some embodiments, the packed variable length code points 615 may be similar to or the same as the packed variable length code points 315 used by the packed variable length code point length determination instruction 304 of FIG. 3. For example, the same sequence of code points may first be processed by the instruction 304 of FIG. 3, and then may be processed by the instruction 606 of FIG. 6.

In some embodiments, the packed variable length code point character bits (e.g., Unicode bits) extraction instruction may explicitly specify or otherwise indicate a second source packed data 616. In some embodiments, the second source packed data may have two or more packed lengths of validated variable length code points of Unicode characters 621. For example, in some embodiments, the packed lengths of the validated variable length code points of Unicode characters 621 may store two or more values indicating the lengths of two or more corresponding UTF-8 code points as either 1-byte, 2-bytes, or optionally 3-bytes or 4-bytes (e.g., in embodiments that use 3-byte or 4-byte UTF-8 code points). For example, in an embodiment using UTF-8, the packed lengths of the validated variable length code points of Unicode characters 621 may store a value (e.g., of three) to indicate a length of 3-bytes for a corresponding UTF-8 code point representing the Euro symbol, a value (e.g., of one) to indicate a length of 1-byte for a corresponding UTF-8 code point representing the dollar sign, and so on.

In some embodiments, the packed lengths 621 may represent a result stored in response to an embodiment of a packed variable length code point character bits (e.g., Unicode bits) extraction instruction 104. That is, in some embodiments, the result of the instruction 104 may be used as a source operand by the instruction 606. For example, in some embodiments, the packed lengths 621 may be similar to or the same as the packed lengths 321 of FIG. 3 and/or the packed lengths 421 of FIG. 4. Any of the features and characteristics described for the packed lengths 321 and/or the packed lengths 421 also optionally apply to the packed lengths 621. Alternatively, other types of packed lengths of validated variable length code points of characters 621 may optionally be used instead and are not limited to being generated by the packed variable length code point length determination instruction 104. Some embodiments are not limited to Unicode characters, but rather may use other characters or standards. Some embodiments are not limited to UTF-8, but rather may use other variable length encodings besides UTF-8.

In some embodiments, the packed variable length code point Unicode bits extraction instruction 606 may optionally explicitly specify or otherwise indicate a destination 620 (e.g., a destination storage location) where a result packed data is to be stored in response to the instruction 606. As another option, one of the sources may be reused as the destination and the source data may be overwritten by the result. In some embodiments, packed sets of extracted Unicode bits 660 may be stored in the destination. Each set of the packed extracted Unicode bits may correspond to a different corresponding variable length code point from the first source 614. Each set of the extracted Unicode bits may include or represent those bits from the corresponding variable length code point that contribute to the Unicode value or other character/symbol value. A set of extracted Unicode bits may be sufficient alone to determine or transcode the Unicode value. In some embodiments, the Unicode bits may be extracted by logically subtracting, or otherwise removing, the signature bits from the corresponding variable length code points, although the scope of the invention is not so limited. For example, the one or more logical operations may be used to remove a signature pattern from the corresponding variable length code points. In some embodiments, any of the previously described signature patterns may be used for this purpose. In other embodiments, bit level bit extraction operations may be performed without such logical operations, for example, by multiplexers, etc. It is to be appreciated that the extraction process may move, rearrange, regroup, concatenate, or otherwise manipulate the extracted Unicode bits in various different ways, as long as the instructions and/or sets of instructions used to process the extracted Unicode bits are able to understand and utilize such manipulations. Without limitation, these packed sets of extracted Unicode bits may be subsequently processed by one or more other instructions to convert them into Unicode values or other character formats.

As shown, in some embodiments, each of the first source packed data 614, the second source packed data 616, and the destination 620 may represent a different packed data register. Alternatively, memory locations, or other storage locations, may be used for one or more of these operands. For example, the packed variable length code points of Unicode characters 615 may optionally instead be stored in a memory location in a memory. Moreover, one or more of the sources and/or destination operands may optionally be implicit to the instruction instead of being explicitly specified. As another option, one of the first and second source operands may optionally be reused as the destination operand and the result packed data may be written over the source packed data.

In some embodiments, a number of code points extracted 664 may also optionally be stored in response to and/or as a result of the packed variable length code point Unicode bits extraction instruction 606, although this is not required. The number of code points extracted may represent the total number of validated code points in the first source operand 614 for which Unicode bits were extracted. For example, if the first source operand had sixteen validated 1-byte code points, then the number of code points extracted may also be sixteen. In some embodiments, the instruction may explicitly specify or implicitly indicate a second destination 662 where the number of extracted code points 664 is to be stored. For example, in one embodiment, the instruction may implicitly indicate a general-purpose register, although the scope of the invention is not so limited.

Figure 7:
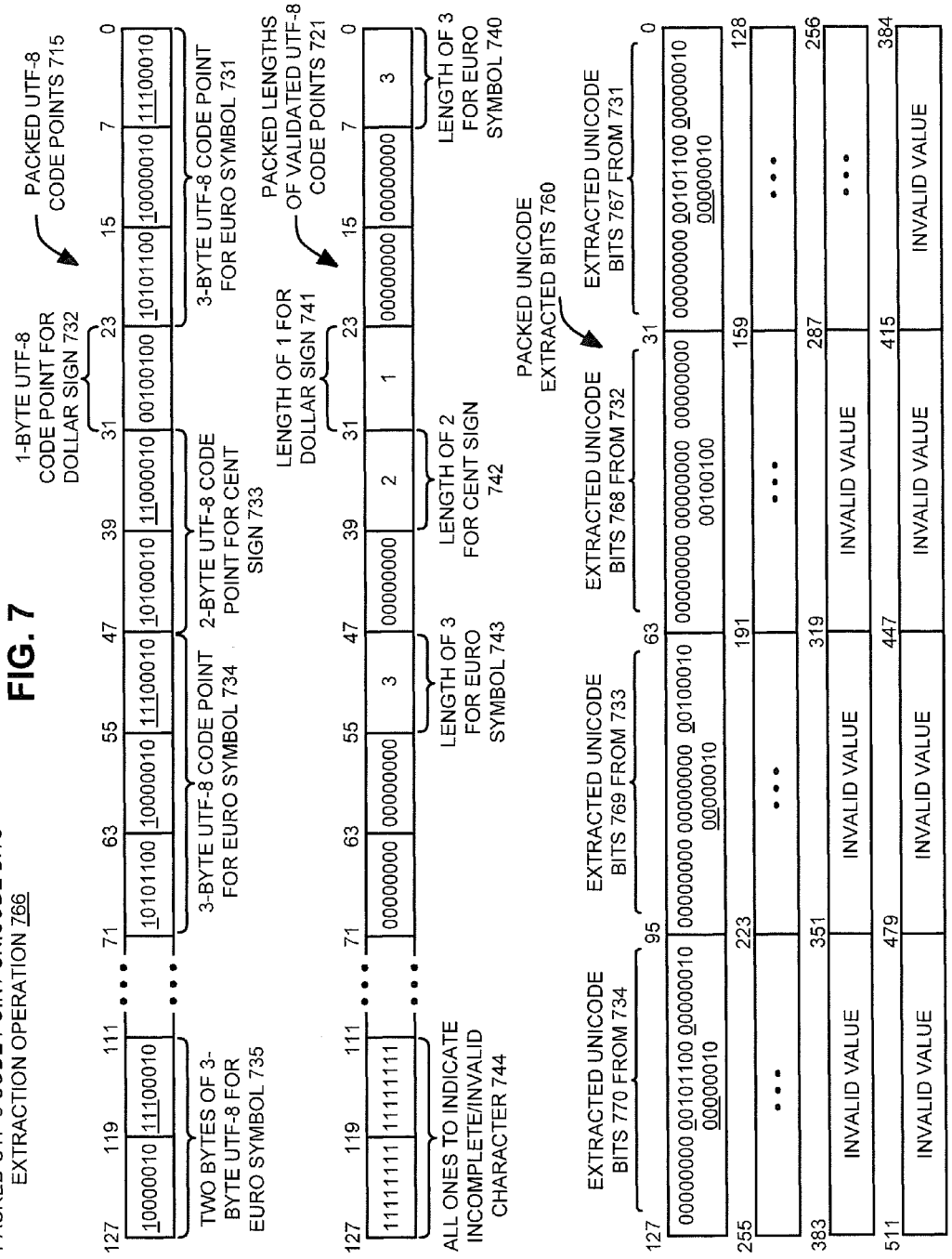
FIG. 7 is a block diagram of an example embodiment of a suitable packed UTF-8 code point character bits (e.g., Unicode bits) extraction operation for UTF-8 code points.

FIG. 7 is a block diagram of an example embodiment of a suitable packed UTF-8 code point Unicode bits extraction operation 766 for UTF-8 code points. The operation may be performed by a processor or other instruction processing apparatus in response to and/or as a result of an example embodiment of a packed UTF-8 code point Unicode bits extraction instruction.

The instruction may specify or otherwise indicate packed UTF-8 code points 715. For example, the packed UTF-8 code points may be in a packed data register or memory location specified or otherwise indicated by the instruction. In the illustrated embodiment, the packed UTF-8 code points operand is 128-bits wide. In other embodiments, other widths may optionally be used, such as, for example, 64-bits, 256-bits, 1024-bits, or some other width. The 128-bits width has sixteen bytes. The sixteen bytes are able to store a variable number of variable length UTF-8 code points, for example, each having from one to two bytes, one to three bytes, or one to four bytes, depending on the implementation. In the illustrated example, the lowest order three bytes in bits [23:0] store a 3-byte UTF-8 code point 731 for the Euro currency symbol (€). The fourth byte in bits [31:24] stores a 1-byte UTF-8 code point 732 for the dollar sign ($). The fifth and sixth bytes in bits [47:32] store a 2-byte UTF-8 code point 733 for the cent sign (¢). The seventh to ninth bytes in bits [71:48] also store a 3-byte UTF-8 code point 734 for the Euro currency symbol. The fifteen and sixteenth bytes in bits [127:112] store an incomplete two of the three bytes of the 3-byte UTF-8 code point 735 for the Euro currency symbol. The remaining third byte is not able to fit within the 128-bit width limits of the operand, and so only an incomplete portion of the symbol is present (e.g. in the 128-bit register). Of course, these are purely exemplary types of code points.

The instruction may also specify or otherwise indicate packed lengths of validated UTF-8 code points 721. In the illustrated embodiment, the packed UTF-8 code points operand is also 128-bits wide. In other embodiments, other widths may optionally be used, such as, for example, 64-bits, 256-bits, 1024-bits, or some other width. The illustrated packed lengths 721 has a value indicating a length of 3-bytes 740 corresponding to the 3-byte UTF-8 code point 731 for the first occurrence of the Euro symbol, a value indicating a length of 1-byte 741 corresponding to the 1-byte UTF-8 code point 732 for the dollar sign, a value indicating a length of 2-bytes 742 corresponding to the 2-byte UTF-8 code point 733 for the cent symbol, and a value indicating a length of 3-bytes 743 corresponding to the 3-byte UTF-8 code point 734 for the second occurrence of the Euro currency symbol. As shown, in some embodiments, the values representing the lengths may optionally be stored in the same relative byte positions of the lowest order bytes of the corresponding UTF-8 code points, and all zeros may optionally be stored in the same relative byte positions of any more significant bytes of the corresponding UTF-8 code points, although this is not required. In other embodiments, other conventions may optionally be used (e.g., zeros may be stored in the least significant byte(s) and lengths in the most significant byte, etc.). Notice that in some embodiments the same number of bytes are used in the packed lengths 721 as are used for the corresponding code points in the packed UTF-8 code points 715 (e.g., three bytes in each, two bytes in each, etc.).

In response to and/or as a result of the packed UTF-8 code point Unicode bits extraction instruction, packed sets of extracted Unicode bits 760 may be stored in a specified or otherwise indicated destination. As shown, in some embodiments, the destination operand may be a 512-bit wide operand (e.g. a 512-bit wide register, two 256-bit registers, four 128-bit registers, etc.). In other embodiments, other widths may optionally be used. Each set of the packed extracted Unicode bits may correspond to a different corresponding variable length code point from the packed UTF-8 code points 715. Each set of the extracted Unicode bits may include or represent those bits from the corresponding variable length code point that contribute to the Unicode value or other character/symbol value. A set of extracted Unicode bits may be sufficient alone to determine or transcode the Unicode value. In some embodiments, the Unicode bits may be extracted by logically subtracting, or otherwise removing, the signature bits and/or patterns from the corresponding variable length code points, although the scope of the invention is not so limited. For example, in some embodiments, the instruction may indicate two or more signature patterns, an appropriate signature pattern may be selected based on the corresponding length information from the packed lengths 721, and one or more logical operations may be used to remove the selected signature pattern from the corresponding variable length code point. The previously described signature patterns are suitable. In some embodiments, the plurality of signature patterns may be stored in a ROM or other non-volatile on-die memory. Alternatively, the instruction may specify or indicate an operand having the plurality of signature patterns. In other embodiments, instead of using such signature patterns, bit level bit extractions may be hardwired, for example, through lines, multiplexers, etc.

Referring again to FIG. 7, the packed sets of extracted Unicode bits 760 include a first set of extracted Unicode bits 767 in bits [31:0] that correspond to the 3-byte UTF-8 code point for the first instance of the Euro symbol 731, and a second set of extracted Unicode bits 768 in bits [63:32] that correspond to the 1-byte UTF-8 code point for the dollar sign 732. The sets of extracted Unicode bits also include a third set of extracted Unicode bits 769 in bits [95:64] that correspond to the 2-byte UTF-8 code point for the cent sign 733, and a fourth set of extracted Unicode bits 770 in bits [127:96] that correspond to the 3-byte UTF-8 code point for the second instance of the Euro sign 734. In the illustration, underlining is used to show that the signature bits or signature patterns as they appear in the packed UTF-8 code points 715 have been removed from the packed sets of extracted Unicode bits 731. That is, the underlined set bits (i.e., binary one) have been converted to the underlined cleared bits (i.e., binary zero). Other sets of extracted Unicode bits may also be included if there are other valid UTF-8 code points in the packed UTF-8 code points 715. For example, up to sixteen sets of extracted Unicode bits, each stored in a 32-bit dword element of the 512-bit destination operand, may be stored in the event that the packed UTF-8 code points 715 includes sixteen 1-byte UTF code points. As shown, in some embodiments, a remainder width of the destination operand may store invalid values which may be any predetermined value recognized by the relevant standards as holding an invalid value or invalid data (e.g., not a recognized Unicode character value).

Figure 8:
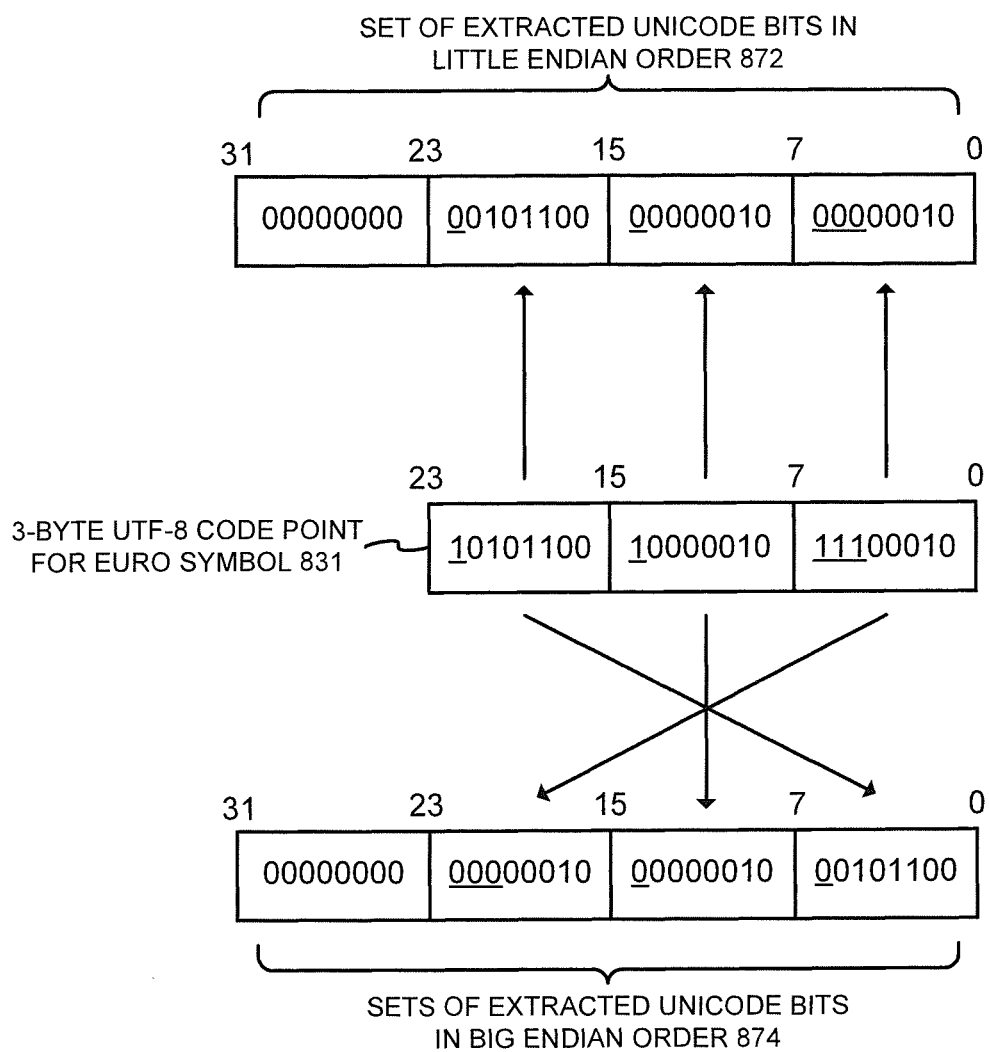
FIG. 8 is a block diagram illustrating suitable ways to arrange or order sets of extracted Unicode bits in a packed data element.

FIG. 8 is a block diagram illustrating suitable ways to arrange or order sets of extracted Unicode bits in a packed data element that may be used by embodiments of packed variable length code point Unicode bits extraction instructions/operations. A 3-byte UTF-8 code point for the Euro symbol 831 is shown. In some embodiments, a corresponding set of extracted Unicode bits may be arranged or ordered in little endian order 872 in a data element of a packed result and/or destination operand. This is similar to the approach shown and described above for FIG. 7. Alternatively, in some embodiments, a corresponding set of extracted Unicode bits may be arranged or ordered in big endian order 874 in a data element of a packed result and/or destination operand. In some embodiments, such an approach may help to facilitate subsequent processing by being arranged in a format that is well suited for certain instructions. However, this approach is not required.

FIG. 9 is a block flow diagram of an embodiment of a method 978 performed by and/or within a processor when processing an embodiment of a packed variable length code point Unicode bits extraction instruction. In some embodiments, the operations and/or method of FIG. 9 may be performed by and/or within the processors of FIG. 1 and/or FIG. 6. The components, features, and specific optional details described herein for the processors of FIG. 1 and/or FIG. 6 also optionally apply to the operations and/or method of FIG. 9, which in embodiments may be performed by and/or within such processors. Alternatively, the operations and/or method of FIG. 9 may be performed by and/or within similar or different processors or other apparatus. Moreover, the processors of FIG. 1 and/or FIG. 6 may perform operations and/or methods that are the same as, similar to, or different than those of FIG. 9.

The method includes receiving a packed variable length code point character bits extraction instruction, at block 979. In various aspects, the instruction may be received at a processor or a portion thereof (e.g., an instruction fetch unit, a decode unit, etc.). In various aspects, the instruction may be received from an off-die source (e.g., from a main memory, a disc, or interconnect), or from an on-die source (e.g., from an instruction cache). In some embodiments, the packed variable length code point character bits extraction instruction may explicitly specify or otherwise indicate a first source packed data having a plurality of packed variable length code points each representing a character. The instruction may also explicitly specify or otherwise indicate a second source packed data having packed lengths of validated variable length code points from the first source packed data. The instruction may also explicitly specify or otherwise indicate a destination storage location. This includes, in some cases, reusing one of the sources as the destination.

A result packed data may be stored in the indicated destination storage location in response to and/or as a result of the packed variable length code point character bits extraction instruction, at block 980. In some embodiments, the result packed data may have packed sets of extracted character bits. Each set of extracted character bits may correspond to a different one of the validated variable length code points from the first source packed data. In some embodiments each set of extracted character bits may be sufficient to determine the character represented by the variable length code points. In some embodiments, the result packed data may be similar to, or the same as, and may optionally have any of the characteristics or features of, the packed sets of extracted bits 660 of FIG. 6 and/or the packed Unicode extracted bits 760 of FIG. 7.

To further illustrate certain concepts, consider a detailed example embodiment of a packed UTF-8 code point Unicode bits extraction instruction with the pneumonic VPVL-NEXTRD. The format of the instruction may be VPVL-NEXTRD DEST, SRC1, SRC2. DEST may represent a 512-bit wide destination packed data register. SRC1 may represent a first 128-bit wide source packed data register or memory location. SRC2 may represent a second 128-bit wide source packed data register. That is, in some embodiments, DEST may be at least four times as wide as each of SRC1 and SRC2. SRC1 may store a chunk of a UTF-8 stream representing a UTF-8 encoded byte sequence. SRC2 may store packed lengths corresponding to validated UTF-8 code points from SRC1.

The instruction may be used to extract Unicode bit fields (i.e., those bits of the UTF-8 encoding that contribute to the Unicode value) from each validated variable length UTF-8 code point in SRC1. The extracted Unicode bit fields from each validated UTF-8 code point in SRC1 may be stored in a different corresponding data element in DEST (e.g., in a corresponding packed 32-bit dword data element in DEST). If the length value indicated by SRC2 (e.g., by a byte in SRC2) is between 1-byte and 4-bytes inclusive, then in some embodiments a corresponding UTF-8 encoding signature pattern for the same byte length may be retrieved, for example, from MSROM or anther on-die non-volatile memory. Alternatively, the instruction may explicitly specify or implicitly indicate another source operand to provide the UTF-8 encoding signature pattern. The UTF-8 encoding signature pattern may be used to remove the signature bits (e.g., bits other than the Unicode bits to be extracted) from the corresponding UTF-8 code point. The remaining Unicode bits represent the Unicode bits to be extracted and are sufficient to determine the Unicode value. These remaining Unicode bits may be stored in a corresponding data element in DEST. For example, in some embodiments, these remaining Unicode bits may be stored in ascending, byte-granular order within a corresponding 32-bit dword data element, although the scope of the invention is not so limited.

In some embodiments, if the byte length indicated by a byte element in SRC2 is greater than 4-bytes (assuming the implementation doesn't support 5-byte or 6-byte UTF-8 code points), then the corresponding 32-bit dword data element in DEST may store a predetermined Unicode value representing invalid input data. In some embodiments, the instruction may also optionally explicitly specify or implicitly indicate a further destination operand where a total number of UTF-8 code points extracted may be stored in response to instruction, although this is not required. As one specific example, the instruction may implicitly indicate a general-purpose register to provide this total number of UTF-8 code points extracted, although the scope of the invention is not so limited. In other embodiments, either wider or narrower registers may optionally be used. For example, in various embodiments, 64-bit, 256-bit, or 512-bit registers may be used for SRC1 and/or SRC2, and registers four times as wide (or combinations of registers) may be used as DEST.

The following pseudocode represents another example embodiment of a suitable packed UTF-8 code point Unicode bits extraction instruction. In this pseudocode, Src1 represents a first 128-bit source packed data having a chunk or sequence of UTF-8 code points. Src2 represents a second 128-bit source packed data having lengths of validated UTF-8 code points. Dest represents a destination. In this pseudocode, the operation Switch(K_m) selects one of the four cases based on the length value of K_m. The symbol <<8 represents a right shift by 8-bits, etc. ZeroExt32 represents a 32-bit most significant bit zero extend operation.

```
m ← 0; // start from the beginning of Src1 having UTF-8 chunk.
m counts bytes
K_m ← Src2[ 7+8*m:8*m]; // validated length of a UTF-8 code point
Dest[511:0] ← Broadcast_dw(Unicode(INVALID_INPUT));
n ← 0; // start from first dword element of Dest. n counts dword elements
in Dest.
Cnt ← 0; // keep track of how many Unicode point extracted
While (m < 16) // 128-bit source has 16-bytes
    If K_m > 0 and K_m <= 4 Then
        Switch(K_m) {
        Case 1: dwMask = ZeroExt32(0x80);
        Case 2: dwMask = ZeroExt32(0x80C0);
        Case 3: dwMask = ZeroExt32(0x8080E0);
        Case 4: dwMask = 0x808080F0;
        }
        Dest[ n*32 + 31: n*32] ← ExtractD(K_m,
        ZeroExt32(Src1_bytes[m +K_m –1: m])) ;
        n ← n + 1;
        m ← m + K_m; // advance to lead byte of next code point
        K_m ← Src2[ 7+8*m:8*m]; // validated length of
        a UTF-8 code point
    Else
        Dest[ n*32 + 31: n*32] ← Unicode(INVALID_INPUT));
        Goto Finish
    Fi;
Wend
Finish:
ECX ← n; // return number of code points extracted. ECX is implicit
register
// In pseudo code the ExtractD( len, dwSrc) is:
ExtractD( len, dwSrc) {
        Switch( len ) {
        Case 1: result[31:0] ← dwSrc[31:0];
        Case 2: result[31:0] ← ZeroExt32( dwSrc[13:8] ) OR
(ZeroExt32( dwSrc[4:0] ) << 8 );
        Case 3: result[31:0] ← ZeroExt32( dwSrc[21:16] ) OR
(ZeroExt32( dwSrc[13:8] ) << 8 ) OR (ZeroExt32( dwSrc[3:0] ) << 16 );
        Case 4: result[31:0] ← ZeroExt32( dwSrc[29:24] ) OR
(ZeroExt32( dwSrc[21:16] ) << 8 ) OR (ZeroExt32( dwSrc[13:8] ) <<
16 ) OR
(ZeroExt32( dwSrc[2:0] ) << 24 );
        }
        Return result[31:0];
}
```

In the description above, UTF-8 formats have been emphasized because of their prevalence. However, other variable length encoding formats besides UTF-8 may be used instead. For example, extensions of UTF-8, derivatives of UTF-8, equivalents of UTF-8, substitutes for UTF-8, or other variable length encoding formats entirely may be used. Furthermore, in the description above, one to four byte code points have been described because of their prevalence and coverage of most characters and languages of importance. However, other embodiments may extend the approaches above to five or six byte code points, if desired.

An instruction set includes one or more instruction formats. A given instruction format defines various fields (number of bits, location of bits) to specify, among other things, the operation to be performed (opcode) and the operand(s) on which that operation is to be performed. Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to the Advanced Vector Extensions (AVX) (AVX1 and AVX2) and using the Vector Extensions (VEX) coding scheme, has been, has been released and/or published (e.g., see Intel® 64 and IA-32 Architectures Software Developers Manual, October 2011; and see Intel® Advanced Vector Extensions Programming Reference, June 2011).

Exemplary Instruction Formats

Embodiments of the instruction(s) described herein may be embodied in different formats. Additionally, exemplary systems, architectures, and pipelines are detailed below. Embodiments of the instruction(s) may be executed on such systems, architectures, and pipelines, but are not limited to those detailed.

Generic Vector Friendly Instruction Format

A vector friendly instruction format is an instruction format that is suited for vector instructions (e.g., there are certain fields specific to vector operations). While embodiments are described in which both vector and scalar operations are supported through the vector friendly instruction format, alternative embodiments use only vector operations the vector friendly instruction format.

Figure 10A:
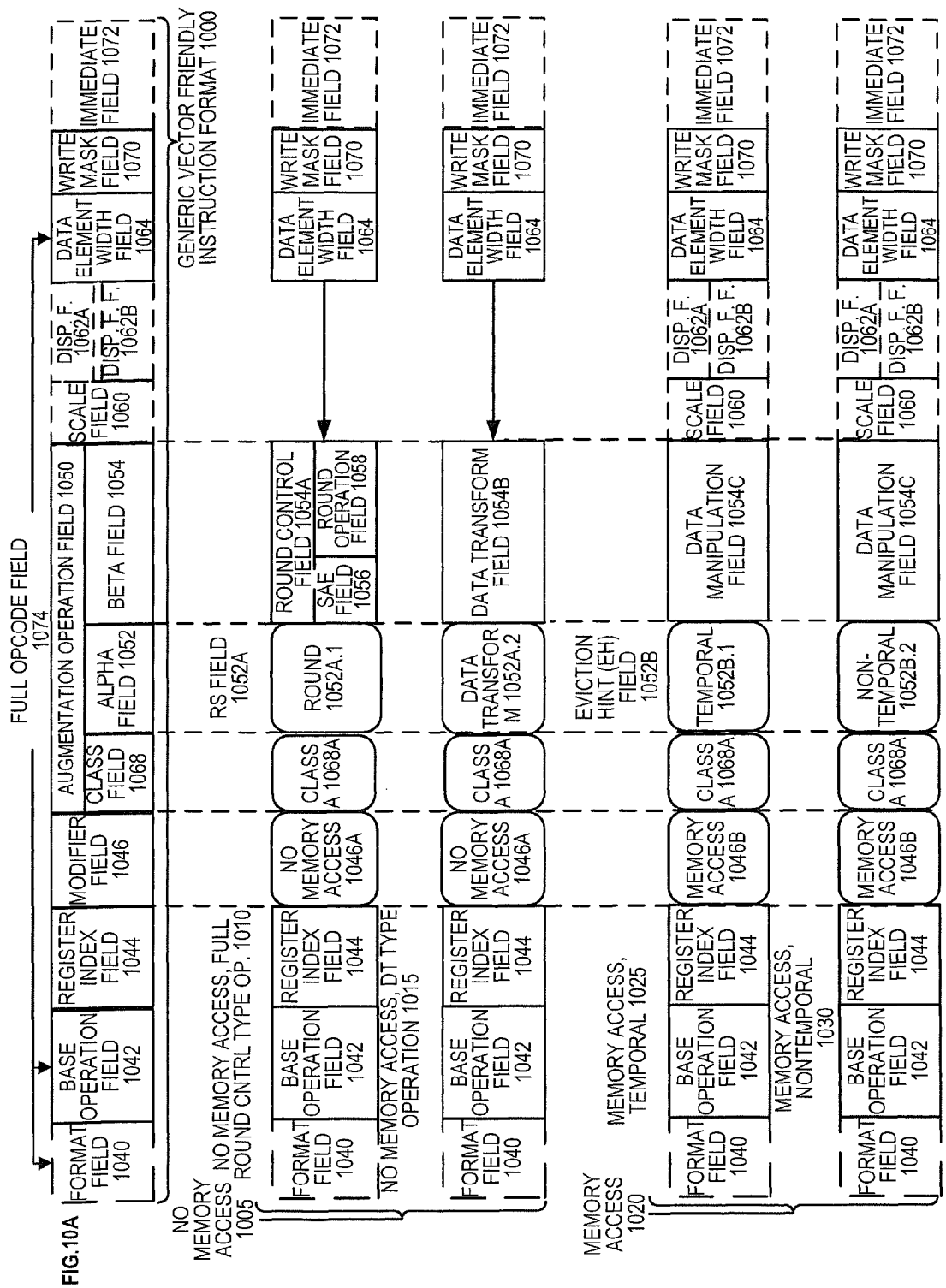
FIG. 10A is a block diagram illustrating a generic vector friendly instruction format and class A instruction templates thereof according to embodiments of the invention.
Figure 10B:
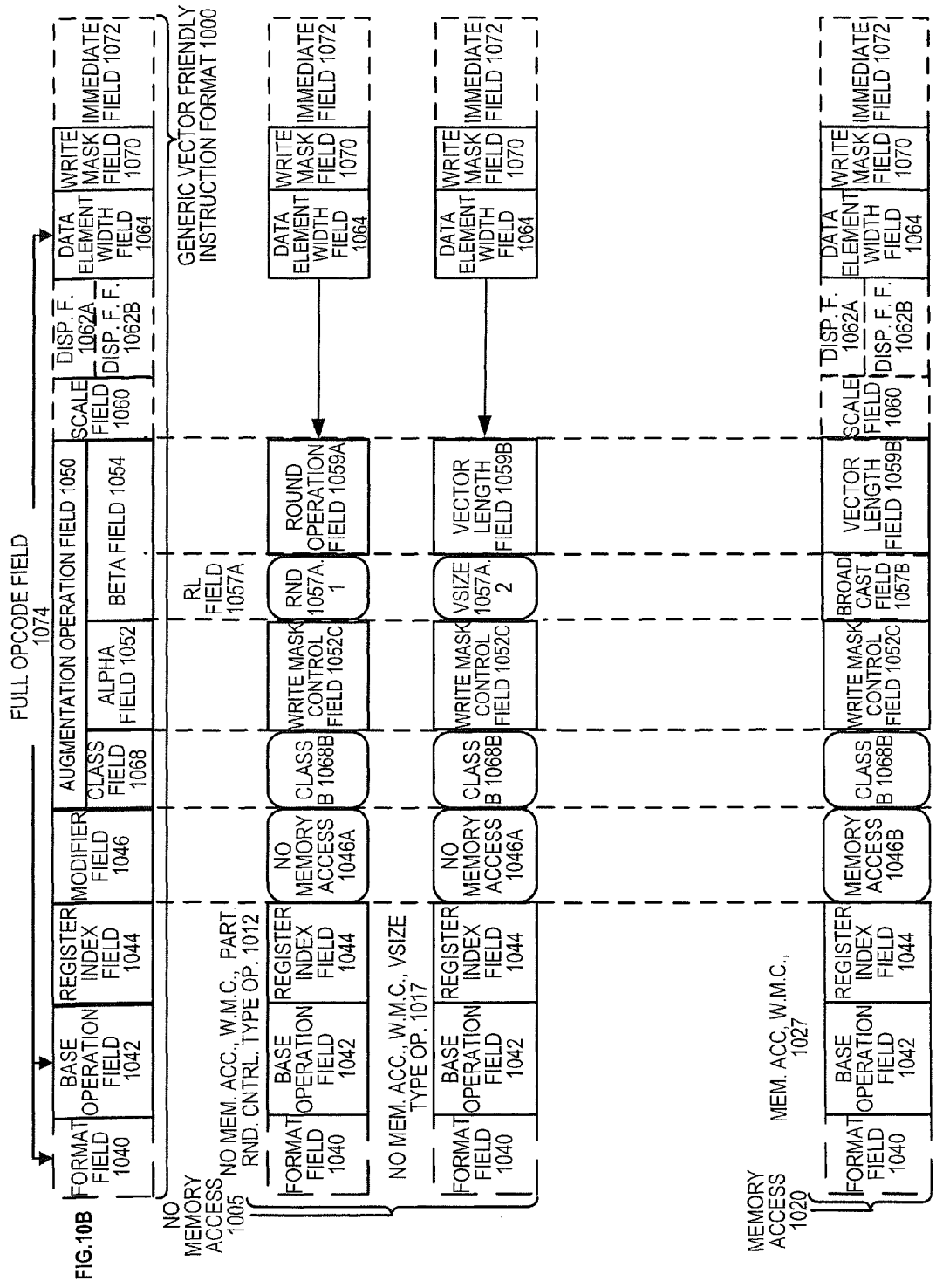
FIG. 10B is a block diagram illustrating the generic vector friendly instruction format and class B instruction templates thereof according to embodiments of the invention.

FIGS. 10A-10B are block diagrams illustrating a generic vector friendly instruction format and instruction templates thereof according to embodiments of the invention. FIG. 10A is a block diagram illustrating a generic vector friendly instruction format and class A instruction templates thereof according to embodiments of the invention; while FIG. 10B is a block diagram illustrating the generic vector friendly instruction format and class B instruction templates thereof according to embodiments of the invention. Specifically, a generic vector friendly instruction format 1000 for which are defined class A and class B instruction templates, both of which include no memory access 1005 instruction templates and memory access 1020 instruction templates. The term generic in the context of the vector friendly instruction format refers to the instruction format not being tied to any specific instruction set.

While embodiments of the invention will be described in which the vector friendly instruction format supports the following: a 64 byte vector operand length (or size) with 32 bit (4 byte) or 64 bit (8 byte) data element widths (or sizes) (and thus, a 64 byte vector consists of either 16 doubleword-size elements or alternatively, 8 quadword-size elements); a 64 byte vector operand length (or size) with 16 bit (2 byte) or 8 bit (1 byte) data element widths (or sizes); a 32 byte vector operand length (or size) with 32 bit (4 byte), 64 bit (8 byte), 16 bit (2 byte), or 8 bit (1 byte) data element widths (or sizes); and a 16 byte vector operand length (or size) with 32 bit (4 byte), 64 bit (8 byte), 16 bit (2 byte), or 8 bit (1 byte) data element widths (or sizes); alternative embodiments may support more, less and/or different vector operand sizes (e.g., 256 byte vector operands) with more, less, or different data element widths (e.g., 128 bit (16 byte) data element widths).

The class A instruction templates in FIG. 10A include: 1) within the no memory access 1005 instruction templates there is shown a no memory access, full round control type operation 1010 instruction template and a no memory access, data transform type operation 1015 instruction template; and 2) within the memory access 1020 instruction templates there is shown a memory access, temporal 1025 instruction template and a memory access, non-temporal 1030 instruction template. The class B instruction templates in FIG. 10B include: 1) within the no memory access 1005 instruction templates there is shown a no memory access, write mask control, partial round control type operation 1012 instruction template and a no memory access, write mask control, vsize type operation 1017 instruction template; and 2) within the memory access 1020 instruction templates there is shown a memory access, write mask control 1027 instruction template.

The generic vector friendly instruction format 1000 includes the following fields listed below in the order illustrated in FIGS. 10A-10B.

Format field 1040—a specific value (an instruction format identifier value) in this field uniquely identifies the vector friendly instruction format, and thus occurrences of instructions in the vector friendly instruction format in instruction streams. As such, this field is optional in the sense that it is not needed for an instruction set that has only the generic vector friendly instruction format.

Base operation field 1042—its content distinguishes different base operations.

Register index field 1044—its content, directly or through address generation, specifies the locations of the source and destination operands, be they in registers or in memory. These include a sufficient number of bits to select N registers from a P×Q (e.g. 32×512, 16×128, 32×1024, 64×1024) register file. While in one embodiment N may be up to three sources and one destination register, alternative embodiments may support more or less sources and destination registers (e.g., may support up to two sources where one of these sources also acts as the destination, may support up to three sources where one of these sources also acts as the destination, may support up to two sources and one destination).

Modifier field 1046—its content distinguishes occurrences of instructions in the generic vector instruction format that specify memory access from those that do not; that is, between no memory access 1005 instruction templates and memory access 1020 instruction templates. Memory access operations read and/or write to the memory hierarchy (in some cases specifying the source and/or destination addresses using values in registers), while non-memory access operations do not (e.g., the source and destinations are registers). While in one embodiment this field also selects between three different ways to perform memory address calculations, alternative embodiments may support more, less, or different ways to perform memory address calculations.

Augmentation operation field 1050—its content distinguishes which one of a variety of different operations to be performed in addition to the base operation. This field is context specific. In one embodiment of the invention, this field is divided into a class field 1068, an alpha field 1052, and a beta field 1054. The augmentation operation field 1050 allows common groups of operations to be performed in a single instruction rather than 2, 3, or 4 instructions.

Scale field 1060—its content allows for the scaling of the index field's content for memory address generation (e.g., for address generation that uses $2^{scale}$*index+base).

Displacement Field 1062A—its content is used as part of memory address generation (e.g., for address generation that uses $2^{scale}$*index+base+displacement).

Displacement Factor Field 1062B (note that the juxtaposition of displacement field 1062A directly over displacement factor field 1062B indicates one or the other is used)—its content is used as part of address generation; it specifies a displacement factor that is to be scaled by the size of a memory access (N)—where N is the number of bytes in the memory access (e.g., for address generation that uses $2^{scale}$*index+base+scaled displacement). Redundant low-order bits are ignored and hence, the displacement factor field's content is multiplied by the memory operands total size (N) in order to generate the final displacement to be used in calculating an effective address. The value of N is determined by the processor hardware at runtime based on the full opcode field 1074 (described later herein) and the data manipulation field 1054C. The displacement field 1062A and the displacement factor field 1062B are optional in the sense that they are not used for the no memory access 1005 instruction templates and/or different embodiments may implement only one or none of the two.

Data element width field 1064—its content distinguishes which one of a number of data element widths is to be used (in some embodiments for all instructions; in other embodiments for only some of the instructions). This field is optional in the sense that it is not needed if only one data element width is supported and/or data element widths are supported using some aspect of the opcodes.

Write mask field 1070—its content controls, on a per data element position basis, whether that data element position in the destination vector operand reflects the result of the base operation and augmentation operation. Class A instruction templates support merging-writemasking, while class B instruction templates support both merging- and zeroing-writemasking. When merging, vector masks allow any set of elements in the destination to be protected from updates during the execution of any operation (specified by the base operation and the augmentation operation); in other one embodiment, preserving the old value of each element of the destination where the corresponding mask bit has a 0. In contrast, when zeroing vector masks allow any set of elements in the destination to be zeroed during the execution of any operation (specified by the base operation and the augmentation operation); in one embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the write mask field 1070 allows for partial vector operations, including loads, stores, arithmetic, logical, etc. While embodiments of the invention are described in which the write mask field's 1070 content selects one of a number of write mask registers that contains the write mask to be used (and thus the write mask field's 1070 content indirectly identifies that masking to be performed), alternative embodiments instead or additional allow the mask write field's 1070 content to directly specify the masking to be performed.

Immediate field 1072—its content allows for the specification of an immediate. This field is optional in the sense that is it not present in an implementation of the generic vector friendly format that does not support immediate and it is not present in instructions that do not use an immediate.

Class field 1068—its content distinguishes between different classes of instructions. With reference to FIGS. 10A-

B, the contents of this field select between class A and class B instructions. In FIGS. 10A-B, rounded corner squares are used to indicate a specific value is present in a field (e.g., class A 1068A and class B 1068B for the class field 1068 respectively in FIGS. 10A-B).

Instruction Templates of Class A

In the case of the non-memory access 1005 instruction templates of class A, the alpha field 1052 is interpreted as an RS field 1052A, whose content distinguishes which one of the different augmentation operation types are to be performed (e.g., round 1052A.1 and data transform 1052A.2 are respectively specified for the no memory access, round type operation 1010 and the no memory access, data transform type operation 1015 instruction templates), while the beta field 1054 distinguishes which of the operations of the specified type is to be performed. In the no memory access 1005 instruction templates, the scale field 1060, the displacement field 1062A, and the displacement scale filed 1062B are not present.

No-Memory Access Instruction Templates—Full Round Control Type Operation

In the no memory access full round control type operation 1010 instruction template, the beta field 1054 is interpreted as a round control field 1054A, whose content(s) provide static rounding. While in the described embodiments of the invention the round control field 1054A includes a suppress all floating point exceptions (SAE) field 1056 and a round operation control field 1058, alternative embodiments may support may encode both these concepts into the same field or only have one or the other of these concepts/fields (e.g., may have only the round operation control field 1058).

SAE field 1056—its content distinguishes whether or not to disable the exception event reporting; when the SAE field's 1056 content indicates suppression is enabled, a given instruction does not report any kind of floating-point exception flag and does not raise any floating point exception handler.

Round operation control field 1058—its content distinguishes which one of a group of rounding operations to perform (e.g., Round-up, Round-down, Round-towards-zero and Round-to-nearest). Thus, the round operation control field 1058 allows for the changing of the rounding mode on a per instruction basis. In one embodiment of the invention where a processor includes a control register for specifying rounding modes, the round operation control field's 1050 content overrides that register value.

No Memory Access Instruction Templates—Data Transform Type Operation

In the no memory access data transform type operation 1015 instruction template, the beta field 1054 is interpreted as a data transform field 1054B, whose content distinguishes which one of a number of data transforms is to be performed (e.g., no data transform, swizzle, broadcast).

In the case of a memory access 1020 instruction template of class A, the alpha field 1052 is interpreted as an eviction hint field 1052B, whose content distinguishes which one of the eviction hints is to be used (in FIG. 10A, temporal 1052B.1 and non-temporal 1052B.2 are respectively specified for the memory access, temporal 1025 instruction template and the memory access, non-temporal 1030 instruction template), while the beta field 1054 is interpreted as a data manipulation field 1054C, whose content distinguishes which one of a number of data manipulation operations (also known as primitives) is to be performed (e.g., no manipulation; broadcast; up conversion of a source; and down conversion of a destination). The memory access 1020 instruction templates include the scale field 1060, and optionally the displacement field 1062A or the displacement scale field 1062B.

Vector memory instructions perform vector loads from and vector stores to memory, with conversion support. As with regular vector instructions, vector memory instructions transfer data from/to memory in a data element-wise fashion, with the elements that are actually transferred is dictated by the contents of the vector mask that is selected as the write mask.

Memory Access Instruction Templates—Temporal

Temporal data is data likely to be reused soon enough to benefit from caching. This is, however, a hint, and different processors may implement it in different ways, including ignoring the hint entirely.

Memory Access Instruction Templates—Non-Temporal

Non-temporal data is data unlikely to be reused soon enough to benefit from caching in the 1st-level cache and should be given priority for eviction. This is, however, a hint, and different processors may implement it in different ways, including ignoring the hint entirely.

Instruction Templates of Class B

In the case of the instruction templates of class B, the alpha field 1052 is interpreted as a write mask control (Z) field 1052C, whose content distinguishes whether the write masking controlled by the write mask field 1070 should be a merging or a zeroing.

In the case of the non-memory access 1005 instruction templates of class B, part of the beta field 1054 is interpreted as an RL field 1057A, whose content distinguishes which one of the different augmentation operation types are to be performed (e.g., round 1057A.1 and vector length (VSIZE) 1057A.2 are respectively specified for the no memory access, write mask control, partial round control type operation 1012 instruction template and the no memory access, write mask control, VSIZE type operation 1017 instruction template), while the rest of the beta field 1054 distinguishes which of the operations of the specified type is to be performed. In the no memory access 1005 instruction templates, the scale field 1060, the displacement field 1062A, and the displacement scale filed 1062B are not present.

In the no memory access, write mask control, partial round control type operation 1010 instruction template, the rest of the beta field 1054 is interpreted as a round operation field 1059A and exception event reporting is disabled (a given instruction does not report any kind of floating-point exception flag and does not raise any floating point exception handler).

Round operation control field 1059A—just as round operation control field 1058, its content distinguishes which one of a group of rounding operations to perform (e.g., Round-up, Round-down, Round-towards-zero and Round-to-nearest). Thus, the round operation control field 1059A allows for the changing of the rounding mode on a per instruction basis. In one embodiment of the invention where a processor includes a control register for specifying rounding modes, the round operation control field's 1050 content overrides that register value.

In the no memory access, write mask control, VSIZE type operation 1017 instruction template, the rest of the beta field 1054 is interpreted as a vector length field 1059B, whose content distinguishes which one of a number of data vector lengths is to be performed on (e.g., 128, 256, or 512 byte).

In the case of a memory access 1020 instruction template of class B, part of the beta field 1054 is interpreted as a broadcast field 1057B, whose content distinguishes whether or not the broadcast type data manipulation operation is to be performed, while the rest of the beta field 1054 is interpreted the vector length field 1059B. The memory access 1020 instruction templates include the scale field 1060, and optionally the displacement field 1062A or the displacement scale field 1062B.

With regard to the generic vector friendly instruction format 1000, a full opcode field 1074 is shown including the format field 1040, the base operation field 1042, and the data element width field 1064. While one embodiment is shown where the full opcode field 1074 includes all of these fields, the full opcode field 1074 includes less than all of these fields in embodiments that do not support all of them. The full opcode field 1074 provides the operation code (opcode).

The augmentation operation field 1050, the data element width field 1064, and the write mask field 1070 allow these features to be specified on a per instruction basis in the generic vector friendly instruction format.

The combination of write mask field and data element width field create typed instructions in that they allow the mask to be applied based on different data element widths.

The various instruction templates found within class A and class B are beneficial in different situations. In some embodiments of the invention, different processors or different cores within a processor may support only class A, only class B, or both classes. For instance, a high performance general purpose out-of-order core intended for general-purpose computing may support only class B, a core intended primarily for graphics and/or scientific (throughput) computing may support only class A, and a core intended for both may support both (of course, a core that has some mix of templates and instructions from both classes but not all templates and instructions from both classes is within the purview of the invention). Also, a single processor may include multiple cores, all of which support the same class or in which different cores support different class. For instance, in a processor with separate graphics and general purpose cores, one of the graphics cores intended primarily for graphics and/or scientific computing may support only class A, while one or more of the general purpose cores may be high performance general purpose cores with out of order execution and register renaming intended for general-purpose computing that support only class B. Another processor that does not have a separate graphics core, may include one more general purpose in-order or out-of-order cores that support both class A and class B. Of course, features from one class may also be implement in the other class in different embodiments of the invention. Programs written in a high level language would be put (e.g., just in time compiled or statically compiled) into an variety of different executable forms, including: 1) a form having only instructions of the class(es) supported by the target processor for execution; or 2) a form having alternative routines written using different combinations of the instructions of all classes and having control flow code that selects the routines to execute based on the instructions supported by the processor which is currently executing the code.

Exemplary Specific Vector Friendly Instruction Format

FIG. 11A is a block diagram illustrating an exemplary specific vector friendly instruction format according to embodiments of the invention. FIG. 11B shows a specific vector friendly instruction format 1100 that is specific in the sense that it specifies the location, size, interpretation, and order of the fields, as well as values for some of those fields. The specific vector friendly instruction format 1100 may be used to extend the x86 instruction set, and thus some of the fields are similar or the same as those used in the existing x86 instruction set and extension thereof (e.g., AVX). This format remains consistent with the prefix encoding field, real opcode byte field, MOD RIM field, SIB field, displacement field, and immediate fields of the existing x86 instruction set with extensions. The fields from FIG. 10 into which the fields from FIG. 11A map are illustrated.

It should be understood that, although embodiments of the invention are described with reference to the specific vector friendly instruction format 1100 in the context of the generic vector friendly instruction format 1000 for illustrative purposes, the invention is not limited to the specific vector friendly instruction format 1100 except where claimed. For example, the generic vector friendly instruction format 1000 contemplates a variety of possible sizes for the various fields, while the specific vector friendly instruction format 1100 is shown as having fields of specific sizes. By way of specific example, while the data element width field 1064 is illustrated as a one bit field in the specific vector friendly instruction format 1100, the invention is not so limited (that is, the generic vector friendly instruction format 1000 contemplates other sizes of the data element width field 1064).

The generic vector friendly instruction format 1000 includes the following fields listed below in the order illustrated in FIG. 11A.

EVEX Prefix (Bytes 0-3) 1102—is encoded in a four-byte form.

Format Field 1040 (EVEX Byte 0, bits [7:0])—the first byte (EVEX Byte 0) is the format field 1040 and it contains 0x62 (the unique value used for distinguishing the vector friendly instruction format in one embodiment of the invention).

The second-fourth bytes (EVEX Bytes 1-3) include a number of bit fields providing specific capability.

REX field 1105 (EVEX Byte 1, bits [7-5])—consists of a EVEX.R bit field (EVEX Byte 1, bit [7]—R), EVEX.X bit field (EVEX byte 1, bit [6]—X), and 1057BEX byte 1, bit[5]—B). The EVEX.R, EVEX.X, and EVEX.B bit fields provide the same functionality as the corresponding VEX bit fields, and are encoded using 1s complement form, i.e. ZMM0 is encoded as 1111B, ZMM15 is encoded as 0000B. Other fields of the instructions encode the lower three bits of the register indexes as is known in the art (nr, xxx, and bbb), so that Rrrr, Xxxx, and Bbbb may be formed by adding EVEX.R, EVEX.X, and EVEX.B.

REX' field 1010—this is the first part of the REX' field 1010 and is the EVEX.R' bit field (EVEX Byte 1, bit [4]—R') that is used to encode either the upper 16 or lower 16 of the extended 32 register set. In one embodiment of the invention, this bit, along with others as indicated below, is stored in bit inverted format to distinguish (in the well-known x86 32-bit mode) from the BOUND instruction, whose real opcode byte is 62, but does not accept in the MOD R/M field (described below) the value of 11 in the MOD field; alternative embodiments of the invention do not store this and the other indicated bits below in the inverted format. A value of 1 is used to encode the lower 16 registers. In other words, R'Rrrr is formed by combining EVEX.R', EVEX.R, and the other RRR from other fields.

Opcode map field 1115 (EVEX byte 1, bits [3:0]—mmmm)—its content encodes an implied leading opcode byte (0F, 0F 38, or 0F 3).

Data element width field 1064 (EVEX byte 2, bit [7]—W)—is represented by the notation EVEX.W. EVEX.W is used to define the granularity (size) of the datatype (either 32-bit data elements or 64-bit data elements).

EVEX.vvvv 1120 (EVEX Byte 2, bits [6:3]—vvvv)—the role of EVEX.vvvv may include the following: 1) EVEX.v- vvv encodes the first source register operand, specified in inverted (1s complement) form and is valid for instructions with 2 or more source operands; 2) EVEX.vvvv encodes the destination register operand, specified in 1s complement form for certain vector shifts; or 3) EVEX.vvvv does not encode any operand, the field is reserved and should contain 1111b. Thus, EVEX.vvvv field 1120 encodes the 4 low-order bits of the first source register specifier stored in inverted (1s complement) form. Depending on the instruction, an extra different EVEX bit field is used to extend the specifier size to 32 registers.

EVEX.U 1068 Class field (EVEX byte 2, bit [2]—U)—If EVEX.U=0, it indicates class A or EVEX.U0; if EVEX.U=1, it indicates class B or EVEX.U1.

Prefix encoding field 1125 (EVEX byte 2, bits [1:0]—pp)—provides additional bits for the base operation field. In addition to providing support for the legacy SSE instructions in the EVEX prefix format, this also has the benefit of compacting the SIMD prefix (rather than requiring a byte to express the SIMD prefix, the EVEX prefix requires only 2 bits). In one embodiment, to support legacy SSE instructions that use a SIMD prefix (66H, F2H, F3H) in both the legacy format and in the EVEX prefix format, these legacy SIMD prefixes are encoded into the SIMD prefix encoding field; and at runtime are expanded into the legacy SIMD prefix prior to being provided to the decoder's PLA (so the PLA can execute both the legacy and EVEX format of these legacy instructions without modification). Although newer instructions could use the EVEX prefix encoding field's content directly as an opcode extension, certain embodiments expand in a similar fashion for consistency but allow for different meanings to be specified by these legacy SIMD prefixes. An alternative embodiment may redesign the PLA to support the 2 bit SIMD prefix encodings, and thus not require the expansion.

Alpha field 1052 (EVEX byte 3, bit [7]—EH; also known as EVEX.EH, EVEX.rs, EVEX.RL, EVEX.write mask control, and EVEX.N; also illustrated with α)—as previously described, this field is context specific.

Beta field 1054 (EVEX byte 3, bits [6:4]—SSS, also known as EVEX.$s_{2-0}$, EVEX.$r_{2-0}$, EVEX.rr1, EVEX.LL0, EVEX.LLB; also illustrated with βββ)—as previously described, this field is context specific.

REX' field 1010—this is the remainder of the REX' field and is the EVEX.V' bit field (EVEX Byte 3, bit [3]—V') that may be used to encode either the upper 16 or lower 16 of the extended 32 register set. This bit is stored in bit inverted format. A value of 1 is used to encode the lower 16 registers. In other words, V'VVVV is formed by combining EVEX.V', EVEX.vvvv.

Write mask field 1070 (EVEX byte 3, bits [2:0]—kkk)—its content specifies the index of a register in the write mask registers as previously described. In one embodiment of the invention, the specific value EVEX kkk=000 has a special behavior implying no write mask is used for the particular instruction (this may be implemented in a variety of ways including the use of a write mask hardwired to all ones or hardware that bypasses the masking hardware).

Real Opcode Field 1130 (Byte 4) is also known as the opcode byte. Part of the opcode is specified in this field.

MOD R/M Field 1140 (Byte 5) includes MOD field 1142, Reg field 1144, and R/M field 1146. As previously described, the MOD field's 1142 content distinguishes between memory access and non-memory access operations. The role of Reg field 1144 can be summarized to two situations: encoding either the destination register operand or a source register operand, or be treated as an opcode extension and not used to encode any instruction operand. The role of R/M field 1146 may include the following: encoding the instruction operand that references a memory address, or encoding either the destination register operand or a source register operand.

Scale, Index, Base (SIB) Byte (Byte 6)—As previously described, the scale field's 1050 content is used for memory address generation. SIB.xxx 1154 and SIB.bbb 1156—the contents of these fields have been previously referred to with regard to the register indexes Xxxx and Bbbb.

Displacement field 1062A (Bytes 7-10)—when MOD field 1142 contains 10, bytes 7-10 are the displacement field 1062A, and it works the same as the legacy 32-bit displacement (disp32) and works at byte granularity.

Displacement factor field 1062B (Byte 7)—when MOD field 1142 contains 01, byte 7 is the displacement factor field 1062B. The location of this field is that same as that of the legacy x86 instruction set 8-bit displacement (disp8), which works at byte granularity. Since disp8 is sign extended, it can only address between −128 and 127 bytes offsets; in terms of 64 byte cache lines, disp8 uses 8 bits that can be set to only four really useful values −128, −64, 0, and 64; since a greater range is often needed, disp32 is used; however, disp32 requires 4 bytes. In contrast to disp8 and disp32, the displacement factor field 1062B is a reinterpretation of disp8; when using displacement factor field 1062B, the actual displacement is determined by the content of the displacement factor field multiplied by the size of the memory operand access (N). This type of displacement is referred to as disp8*N. This reduces the average instruction length (a single byte of used for the displacement but with a much greater range). Such compressed displacement is based on the assumption that the effective displacement is multiple of the granularity of the memory access, and hence, the redundant low-order bits of the address offset do not need to be encoded. In other words, the displacement factor field 1062B substitutes the legacy x86 instruction set 8-bit displacement. Thus, the displacement factor field 1062B is encoded the same way as an x86 instruction set 8-bit displacement (so no changes in the ModRM/SIB encoding rules) with the only exception that disp8 is overloaded to disp8*N. In other words, there are no changes in the encoding rules or encoding lengths but only in the interpretation of the displacement value by hardware (which needs to scale the displacement by the size of the memory operand to obtain a byte-wise address offset).

Immediate field 1072 operates as previously described.

Full Opcode Field

FIG. 11B is a block diagram illustrating the fields of the specific vector friendly instruction format 1100 that make up the full opcode field 1074 according to one embodiment of the invention. Specifically, the full opcode field 1074 includes the format field 1040, the base operation field 1042, and the data element width (W) field 1064. The base operation field 1042 includes the prefix encoding field 1125, the opcode map field 1115, and the real opcode field 1130.

Register Index Field

FIG. 11C is a block diagram illustrating the fields of the specific vector friendly instruction format 1100 that make up the register index field 1044 according to one embodiment of the invention. Specifically, the register index field 1044 includes the REX field 1105, the REX' field 1110, the MODR/M.reg field 1144, the MODR/M.r/m field 1146, the VVVV field 1120, xxx field 1154, and the bbb field 1156.

Augmentation Operation Field

Figure 11D:
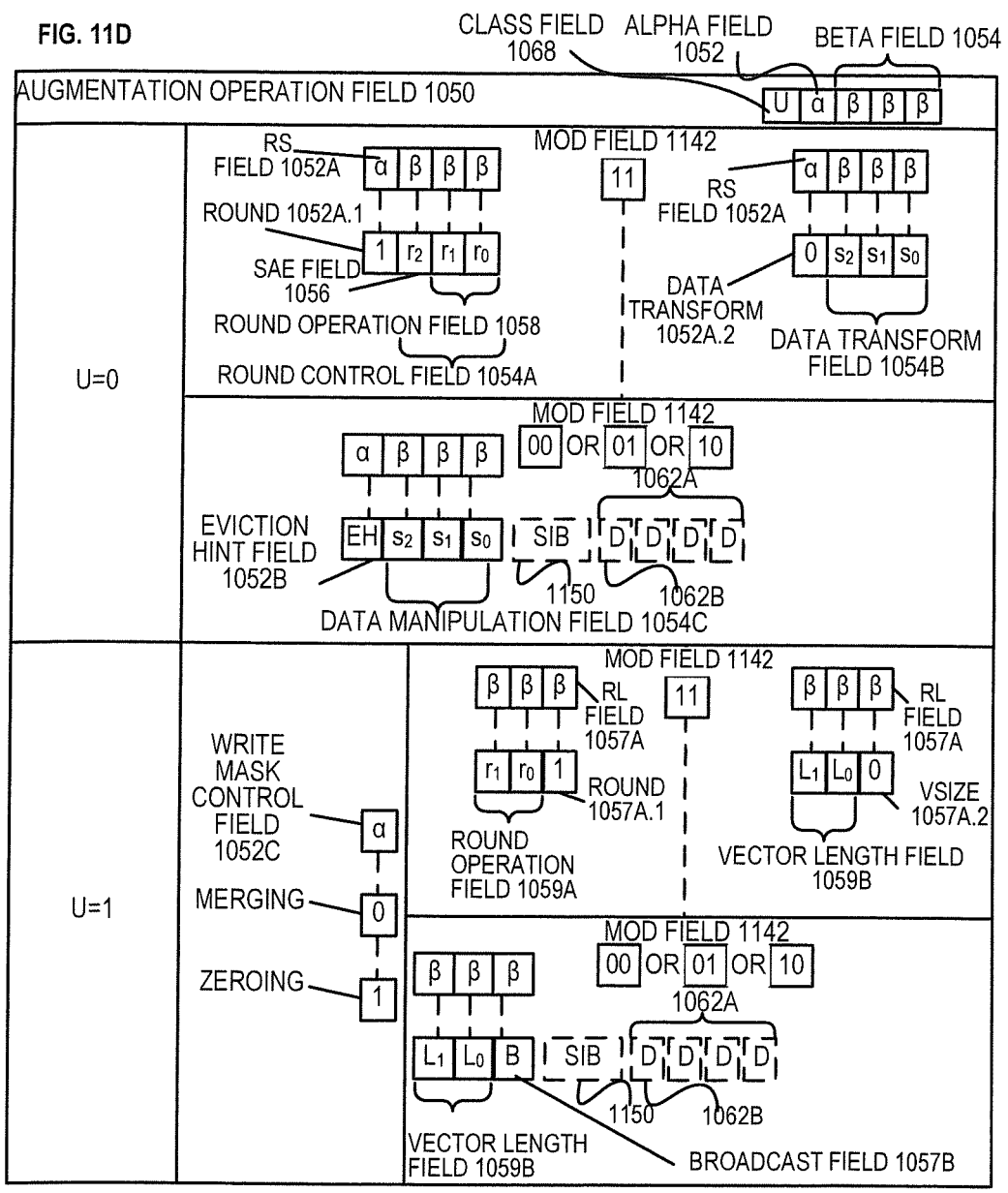
FIG. 11D is a block diagram illustrating the fields of the specific vector friendly instruction format that make up the augmentation operation field according to one embodiment of the invention.

FIG. 11D is a block diagram illustrating the fields of the specific vector friendly instruction format 1100 that make up the augmentation operation field 1050 according to one embodiment of the invention. When the class (U) field 1068 contains 0, it signifies EVEX.U0 (class A 1068A); when it contains 1, it signifies EVEX.U1 (class B 1068B). When U=0 and the MOD field 1142 contains 11 (signifying a no memory access operation), the alpha field 1052 (EVEX byte 3, bit [7]—EH) is interpreted as the rs field 1052A. When the rs field 1052A contains a 1 (round 1052A.1), the beta field 1054 (EVEX byte 3, bits [6:4]—SSS) is interpreted as the round control field 1054A. The round control field 1054A includes a one bit SAE field 1056 and a two bit round operation field 1058. When the rs field 1052A contains a 0 (data transform 1052A.2), the beta field 1054 (EVEX byte 3, bits [6:4]—SSS) is interpreted as a three bit data transform field 1054B. When U=0 and the MOD field 1142 contains 00, 01, or 10 (signifying a memory access operation), the alpha field 1052 (EVEX byte 3, bit [7]—EH) is interpreted as the eviction hint (EH) field 1052B and the beta field 1054 (EVEX byte 3, bits [6:4]—SSS) is interpreted as a three bit data manipulation field 1054C.

When U=1, the alpha field 1052 (EVEX byte 3, bit [7]—EH) is interpreted as the write mask control (Z) field 1052C. When U=1 and the MOD field 1142 contains 11 (signifying a no memory access operation), part of the beta field 1054 (EVEX byte 3, bit [4]—$S_0$) is interpreted as the RL field 1057A; when it contains a 1 (round 1057A.1) the rest of the beta field 1054 (EVEX byte 3, bit [6-5]—$S_{2-1}$) is interpreted as the round operation field 1059A, while when the RL field 1057A contains a 0 (VSIZE 1057.A2) the rest of the beta field 1054 (EVEX byte 3, bit [6-5]—$S_{2-1}$) is interpreted as the vector length field 1059B (EVEX byte 3, bit [6-5]—$L_{1-0}$). When U=1 and the MOD field 1142 contains 00, 01, or 10 (signifying a memory access operation), the beta field 1054 (EVEX byte 3, bits [6:4]—SSS) is interpreted as the vector length field 1059B (EVEX byte 3, bit [6-5]—$L_{1-0}$) and the broadcast field 1057B (EVEX byte 3, bit [4]—B).

Exemplary Register Architecture

Figure 12:
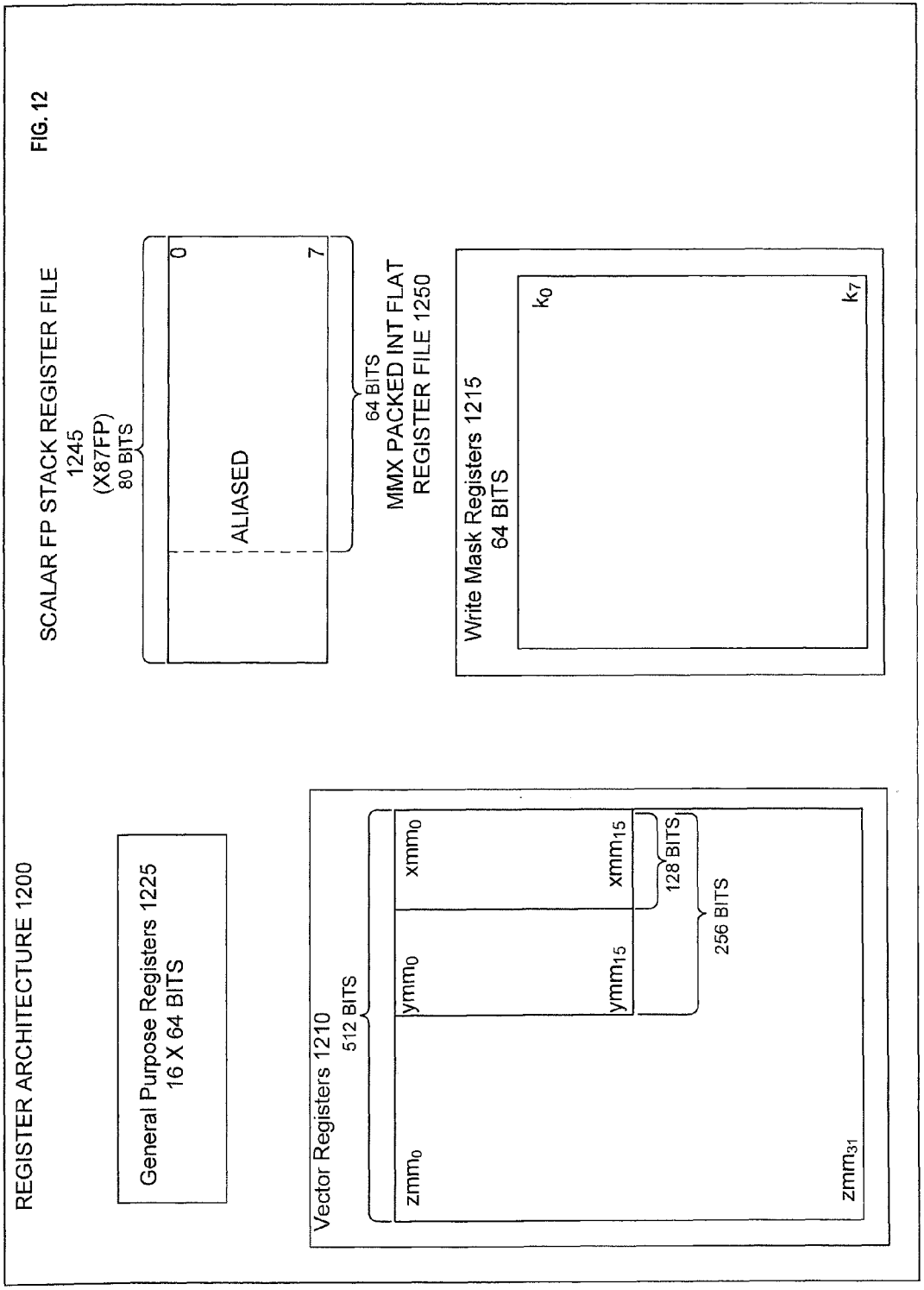
FIG. 12 is a block diagram of a register architecture according to one embodiment of the invention.

FIG. 12 is a block diagram of a register architecture 1200 according to one embodiment of the invention. In the embodiment illustrated, there are 32 vector registers 1210 that are 512 bits wide; these registers are referenced as zmm0 through zmm31. The lower order 256 bits of the lower 16 zmm registers are overlaid on registers ymm0-16. The lower order 128 bits of the lower 16 zmm registers (the lower order 128 bits of the ymm registers) are overlaid on registers xmm0-15. The specific vector friendly instruction format 1100 operates on these overlaid register file as illustrated in the below tables.

length. Further, in one embodiment, the class B instruction templates of the specific vector friendly instruction format 1100 operate on packed or scalar single/double-precision floating point data and packed or scalar integer data. Scalar operations are operations performed on the lowest order data element position in an zmm/ymm/xmm register; the higher order data element positions are either left the same as they were prior to the instruction or zeroed depending on the embodiment.

Write mask registers 1215—in the embodiment illustrated, there are 8 write mask registers (k0 through k7), each 64 bits in size. In an alternate embodiment, the write mask registers 1215 are 16 bits in size. As previously described, in one embodiment of the invention, the vector mask register k0 cannot be used as a write mask; when the encoding that would normally indicate k0 is used for a write mask, it selects a hardwired write mask of 0xFFFF, effectively disabling write masking for that instruction.

General-purpose registers 1225—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 1245, on which is aliased the MMX packed integer flat register file 1250—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the invention may use wider or narrower registers. Additionally, alternative embodiments of the invention may use more, less, or different register files and registers.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-

| Adjustable Vector Length | Class | Operations | Registers |
|---|---|---|---|
| Instruction Templates that do not include the vector length field 1059B | A (FIG. 10A; U = 0) | 1010, 1015, 1025, 1030 | zmm registers (the vector length is 64 byte) |
| | B (FIG. 10B; U = 1) | 1012 | zmm registers (the vector length is 64 byte) |
| Instruction templates that do include the vector length field 1059B | B (FIG. 10B; U = 1) | 1017, 1027 | zmm, ymm, or xmm registers (the vector length is 64 byte, 32 byte, or 16 byte) depending on the vector length field 1059B |

In other words, the vector length field 1059B selects between a maximum length and one or more other shorter lengths, where each such shorter length is half the length of the preceding length; and instructions templates without the vector length field 1059B operate on the maximum vector purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 13A is a block diagram illustrating both an exemplary in-order pipeline and an exemplary register renaming, out-of-order issue/execution pipeline according to embodiments of the invention. FIG. 13B is a block diagram illustrating both an exemplary embodiment of an in-order architecture core and an exemplary register renaming, out-of-order issue/execution architecture core to be included in a processor according to embodiments of the invention. The solid lined boxes in FIGS. 13A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 13A, a processor pipeline 1300 includes a fetch stage 1302, a length decode stage 1304, a decode stage 1306, an allocation stage 1308, a renaming stage 1310, a scheduling (also known as a dispatch or issue) stage 1312, a register read/memory read stage 1314, an execute stage 1316, a write back/memory write stage 1318, an exception handling stage 1322, and a commit stage 1324.

FIG. 13B shows processor core 1390 including a front end unit 1330 coupled to an execution engine unit 1350, and both are coupled to a memory unit 1370. The core 1390 may be a reduced instruction set computing (RISC) core, a complex instruction set computing (CISC) core, a very long instruction word (VLIW) core, or a hybrid or alternative core type. As yet another option, the core 1390 may be a special-purpose core, such as, for example, a network or communication core, compression engine, coprocessor core, general purpose computing graphics processing unit (GPGPU) core, graphics core, or the like.

The front end unit 1330 includes a branch prediction unit 1332 coupled to an instruction cache unit 1334, which is coupled to an instruction translation lookaside buffer (TLB) 1336, which is coupled to an instruction fetch unit 1338, which is coupled to a decode unit 1340. The decode unit 1340 (or decoder) may decode instructions, and generate as an output one or more micro-operations, micro-code entry points, microinstructions, other instructions, or other control signals, which are decoded from, or which otherwise reflect, or are derived from, the original instructions. The decode unit 1340 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1390 includes a microcode ROM or other medium that stores microcode for certain macroinstructions (e.g., in decode unit 1340 or otherwise within the front end unit 1330). The decode unit 1340 is coupled to a rename/allocator unit 1352 in the execution engine unit 1350.

The execution engine unit 1350 includes the rename/allocator unit 1352 coupled to a retirement unit 1354 and a set of one or more scheduler unit(s) 1356. The scheduler unit(s) 1356 represents any number of different schedulers, including reservations stations, central instruction window, etc. The scheduler unit(s) 1356 is coupled to the physical register file(s) unit(s) 1358. Each of the physical register file(s) units 1358 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 1358 comprises a vector registers unit, a write mask registers unit, and a scalar registers unit. These register units may provide architectural vector registers, vector mask registers, and general purpose registers. The physical register file(s) unit(s) 1358 is overlapped by the retirement unit 1354 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1354 and the physical register file(s) unit(s) 1358 are coupled to the execution cluster(s) 1360. The execution cluster(s) 1360 includes a set of one or more execution units 1362 and a set of one or more memory access units 1364. The execution units 1362 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1356, physical register file(s) unit(s) 1358, and execution cluster(s) 1360 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1364). It should also be understood that where separate pipelines are used, one or more of these pipelines may be out-of-order issue/execution and the rest in-order.

The set of memory access units 1364 is coupled to the memory unit 1370, which includes a data TLB unit 1372 coupled to a data cache unit 1374 coupled to a level 2 (L2) cache unit 1376. In one exemplary embodiment, the memory access units 1364 may include a load unit, a store address unit, and a store data unit, each of which is coupled to the data TLB unit 1372 in the memory unit 1370. The instruction cache unit 1334 is further coupled to a level 2 (L2) cache unit 1376 in the memory unit 1370. The L2 cache unit 1376 is coupled to one or more other levels of cache and eventually to a main memory.

By way of example, the exemplary register renaming, out-of-order issue/execution core architecture may implement the pipeline 1300 as follows: 1) the instruction fetch 1338 performs the fetch and length decoding stages 1302 and 1304; 2) the decode unit 1340 performs the decode stage 1306; 3) the rename/allocator unit 1352 performs the allocation stage 1308 and renaming stage 1310; 4) the scheduler unit(s) 1356 performs the schedule stage 1312; 5) the physical register file(s) unit(s) 1358 and the memory unit 1370 perform the register read/memory read stage 1314; the execution cluster 1360 perform the execute stage 1316; 6) the memory unit 1370 and the physical register file(s) unit(s) 1358 perform the write back/memory write stage 1318; 7) various units may be involved in the exception handling stage 1322; and 8) the retirement unit 1354 and the physical register file(s) unit(s) 1358 perform the commit stage 1324.

The core 1390 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 1390 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 1334/1374 and a shared L2 cache unit 1376, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 14B:
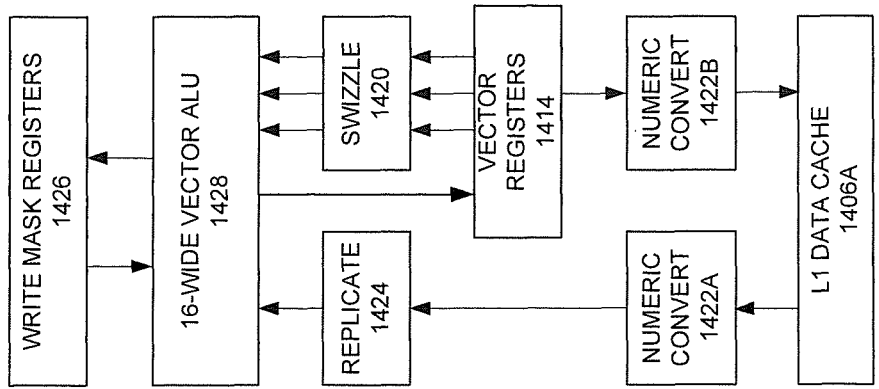
FIG. 14B is an expanded view of part of the processor core in FIG. 14A according to embodiments of the invention.
Figure 14A:
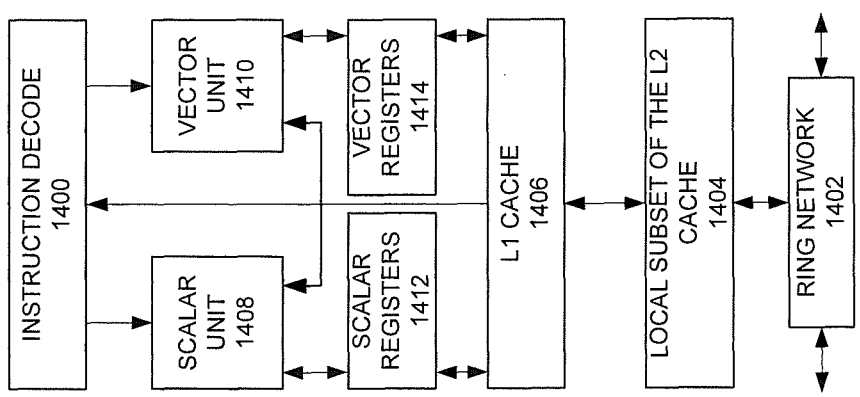
FIG. 14A is a block diagram of a single processor core, along with its connection to the on-die interconnect network and with its local subset of the Level 2 (L2) cache, according to embodiments of the invention.

FIGS. 14A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 14A is a block diagram of a single processor core, along with its connection to the on-die interconnect network 1402 and with its local subset of the Level 2 (L2) cache 1404, according to embodiments of the invention. In one embodiment, an instruction decoder 1400 supports the x86 instruction set with a packed data instruction set extension. An L1 cache 1406 allows low-latency accesses to cache memory into the scalar and vector units. While in one embodiment (to simplify the design), a scalar unit 1408 and a vector unit 1410 use separate register sets (respectively, scalar registers 1412 and vector registers 1414) and data transferred between them is written to memory and then read back in from a level 1 (L1) cache 1406, alternative embodiments of the invention may use a different approach (e.g., use a single register set or include a communication path that allow data to be transferred between the two register files without being written and read back).

The local subset of the L2 cache 1404 is part of a global L2 cache that is divided into separate local subsets, one per processor core. Each processor core has a direct access path to its own local subset of the L2 cache 1404. Data read by a processor core is stored in its L2 cache subset 1404 and can be accessed quickly, in parallel with other processor cores accessing their own local L2 cache subsets. Data written by a processor core is stored in its own L2 cache subset 1404 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 14B is an expanded view of part of the processor core in FIG. 14A according to embodiments of the invention. FIG. 14B includes an L1 data cache 1406A part of the L1 cache 1404, as well as more detail regarding the vector unit 1410 and the vector registers 1414. Specifically, the vector unit 1410 is a 16-wide vector processing unit (VPU) (see the 16-wide ALU 1428), which executes one or more of integer, single-precision float, and double-precision float instructions. The VPU supports swizzling the register inputs with swizzle unit 1420, numeric conversion with numeric convert units 1422A-B, and replication with replication unit 1424 on the memory input. Write mask registers 1426 allow predicating resulting vector writes.

Processor with Integrated Memory Controller and Graphics

Figure 15:
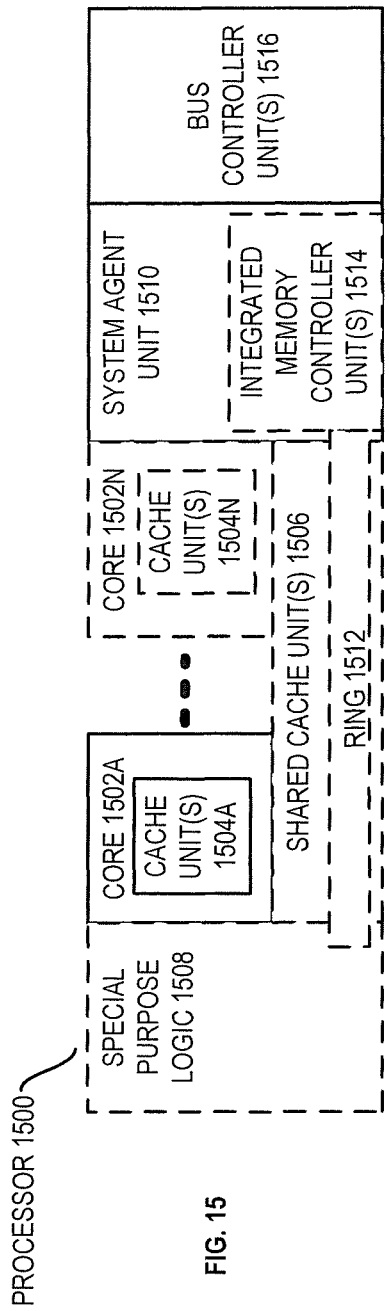
FIG. 15 is a block diagram of a processor that may have more than one core, may have an integrated memory controller, and may have integrated graphics according to embodiments of the invention.

FIG. 15 is a block diagram of a processor 1500 that may have more than one core, may have an integrated memory controller, and may have integrated graphics according to embodiments of the invention. The solid lined boxes in FIG. 15 illustrate a processor 1500 with a single core 1502A, a system agent 1510, a set of one or more bus controller units 1516, while the optional addition of the dashed lined boxes illustrates an alternative processor 1500 with multiple cores 1502A-N, a set of one or more integrated memory controller unit(s) 1514 in the system agent unit 1510, and special purpose logic 1508.

Thus, different implementations of the processor 1500 may include: 1) a CPU with the special purpose logic 1508 being integrated graphics and/or scientific (throughput) logic (which may include one or more cores), and the cores 1502A-N being one or more general purpose cores (e.g., general purpose in-order cores, general purpose out-of-order cores, a combination of the two); 2) a coprocessor with the cores 1502A-N being a large number of special purpose cores intended primarily for graphics and/or scientific (throughput); and 3) a coprocessor with the cores 1502A-N being a large number of general purpose in-order cores. Thus, the processor 1500 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1500 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1506, and external memory (not shown) coupled to the set of integrated memory controller units 1514. The set of shared cache units 1506 may include one or more mid-level caches, such as level 2 (L2), level 3 (L3), level 4 (L4), or other levels of cache, a last level cache (LLC), and/or combinations thereof. While in one embodiment a ring based interconnect unit 1512 interconnects the integrated graphics logic 1508, the set of shared cache units 1506, and the system agent unit 1510/integrated memory controller unit(s) 1514, alternative embodiments may use any number of well-known techniques for interconnecting such units. In one embodiment, coherency is maintained between one or more cache units 1506 and cores 1502-A-N.

In some embodiments, one or more of the cores 1502A-N are capable of multithreading. The system agent 1510 includes those components coordinating and operating cores 1502A-N. The system agent unit 1510 may include for example a power control unit (PCU) and a display unit. The PCU may be or include logic and components needed for regulating the power state of the cores 1502A-N and the integrated graphics logic 1508. The display unit is for driving one or more externally connected displays.

The cores 1502A-N may be homogenous or heterogeneous in terms of architecture instruction set; that is, two or more of the cores 1502A-N may be capable of execution the same instruction set, while others may be capable of executing only a subset of that instruction set or a different instruction set.

Exemplary Computer Architectures

FIGS. 16-19 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 16:
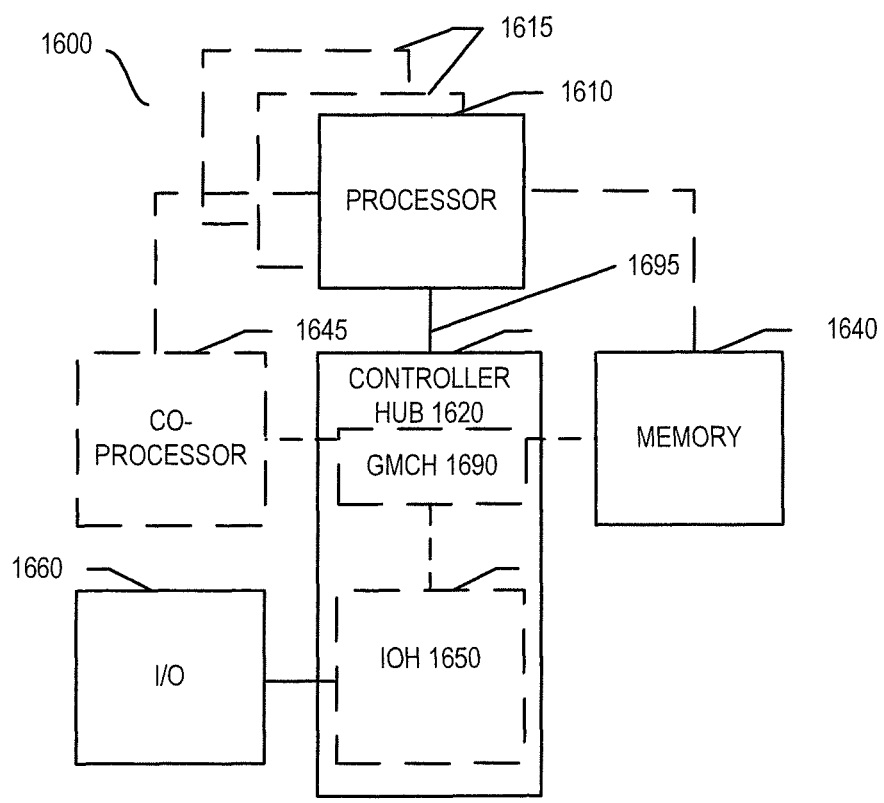
FIG. 16 shown is a block diagram of a system in accordance with one embodiment of the present invention.

Referring now to FIG. 16, shown is a block diagram of a system 1600 in accordance with one embodiment of the present invention. The system 1600 may include one or more processors 1610, 1615, which are coupled to a controller hub 1620. In one embodiment the controller hub 1620 includes a graphics memory controller hub (GMCH) 1690 and an Input/Output Hub (IOH) 1650 (which may be on separate chips); the GMCH 1690 includes memory and graphics controllers to which are coupled memory 1640 and a coprocessor 1645; the IOH 1650 is couples input/output (I/O) devices 1660 to the GMCH 1690. Alternatively, one or both of the memory and graphics controllers are integrated within the processor (as described herein), the memory 1640 and the coprocessor 1645 are coupled directly to the processor 1610, and the controller hub 1620 in a single chip with the IOH 1650.

The optional nature of additional processors 1615 is denoted in FIG. 16 with broken lines. Each processor 1610, 1615 may include one or more of the processing cores described herein and may be some version of the processor 1500.

The memory 1640 may be, for example, dynamic random access memory (DRAM), phase change memory (PCM), or a combination of the two. For at least one embodiment, the controller hub 1620 communicates with the processor(s) 1610, 1615 via a multi-drop bus, such as a frontside bus (FSB), point-to-point interface such as QuickPath Interconnect (QPI), or similar connection 1695.

In one embodiment, the coprocessor 1645 is a special-purpose processor, such as, for example, a high-throughput MIC processor, a network or communication processor, compression engine, graphics processor, GPGPU, embedded processor, or the like. In one embodiment, controller hub 1620 may include an integrated graphics accelerator.

There can be a variety of differences between the physical resources 1610, 1615 in terms of a spectrum of metrics of merit including architectural, microarchitectural, thermal, power consumption characteristics, and the like.

In one embodiment, the processor 1610 executes instructions that control data processing operations of a general type. Embedded within the instructions may be coprocessor instructions. The processor 1610 recognizes these coprocessor instructions as being of a type that should be executed by the attached coprocessor 1645. Accordingly, the processor 1610 issues these coprocessor instructions (or control signals representing coprocessor instructions) on a coprocessor bus or other interconnect, to coprocessor 1645. Coprocessor(s) 1645 accept and execute the received coprocessor instructions.

Figure 17:
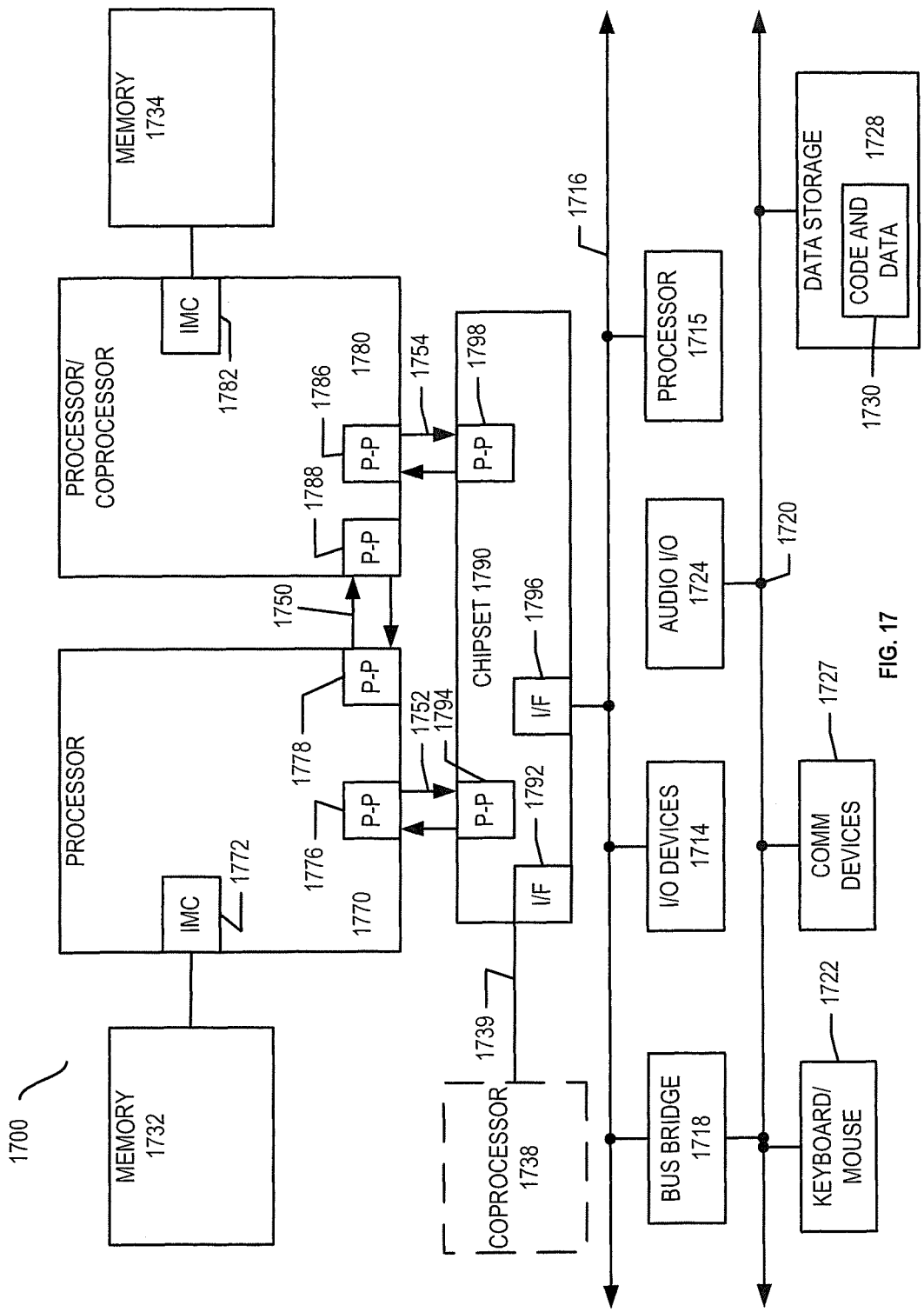
FIG. 17 shown is a block diagram of a first more specific exemplary system in accordance with an embodiment of the present invention.

Referring now to FIG. 17, shown is a block diagram of a first more specific exemplary system 1700 in accordance with an embodiment of the present invention. As shown in FIG. 17, multiprocessor system 1700 is a point-to-point interconnect system, and includes a first processor 1770 and a second processor 1780 coupled via a point-to-point interconnect 1750. Each of processors 1770 and 1780 may be some version of the processor 1500. In one embodiment of the invention, processors 1770 and 1780 are respectively processors 1610 and 1615, while coprocessor 1738 is coprocessor 1645. In another embodiment, processors 1770 and 1780 are respectively processor 1610 coprocessor 1645.

Processors 1770 and 1780 are shown including integrated memory controller (IMC) units 1772 and 1782, respectively. Processor 1770 also includes as part of its bus controller units point-to-point (P-P) interfaces 1776 and 1778; similarly, second processor 1780 includes P-P interfaces 1786 and 1788. Processors 1770, 1780 may exchange information via a point-to-point (P-P) interface 1750 using P-P interface circuits 1778, 1788. As shown in FIG. 17, IMCs 1772 and 1782 couple the processors to respective memories, namely a memory 1732 and a memory 1734, which may be portions of main memory locally attached to the respective processors.

Processors 1770, 1780 may each exchange information with a chipset 1790 via individual P-P interfaces 1752, 1754 using point to point interface circuits 1776, 1794, 1786, 1798. Chipset 1790 may optionally exchange information with the coprocessor 1738 via a high-performance interface 1739. In one embodiment, the coprocessor 1738 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1790 may be coupled to a first bus 1716 via an interface 1796. In one embodiment, first bus 1716 may be a Peripheral Component Interconnect (PCI) bus, or a bus such as a PCI Express bus or another third generation I/O interconnect bus, although the scope of the present invention is not so limited.

As shown in FIG. 17, various I/O devices 1714 may be coupled to first bus 1716, along with a bus bridge 1718 which couples first bus 1716 to a second bus 1720. In one embodiment, one or more additional processor(s) 1715, such as coprocessors, high-throughput MIC processors, GPGPU's, accelerators (such as, e.g., graphics accelerators or digital signal processing (DSP) units), field programmable gate arrays, or any other processor, are coupled to first bus 1716. In one embodiment, second bus 1720 may be a low pin count (LPC) bus. Various devices may be coupled to a second bus 1720 including, for example, a keyboard and/or mouse 1722, communication devices 1727 and a storage unit 1728 such as a disk drive or other mass storage device which may include instructions/code and data 1730, in one embodiment. Further, an audio I/O 1724 may be coupled to the second bus 1720. Note that other architectures are possible. For example, instead of the point-to-point architecture of FIG. 17, a system may implement a multi-drop bus or other such architecture.

Figure 18:
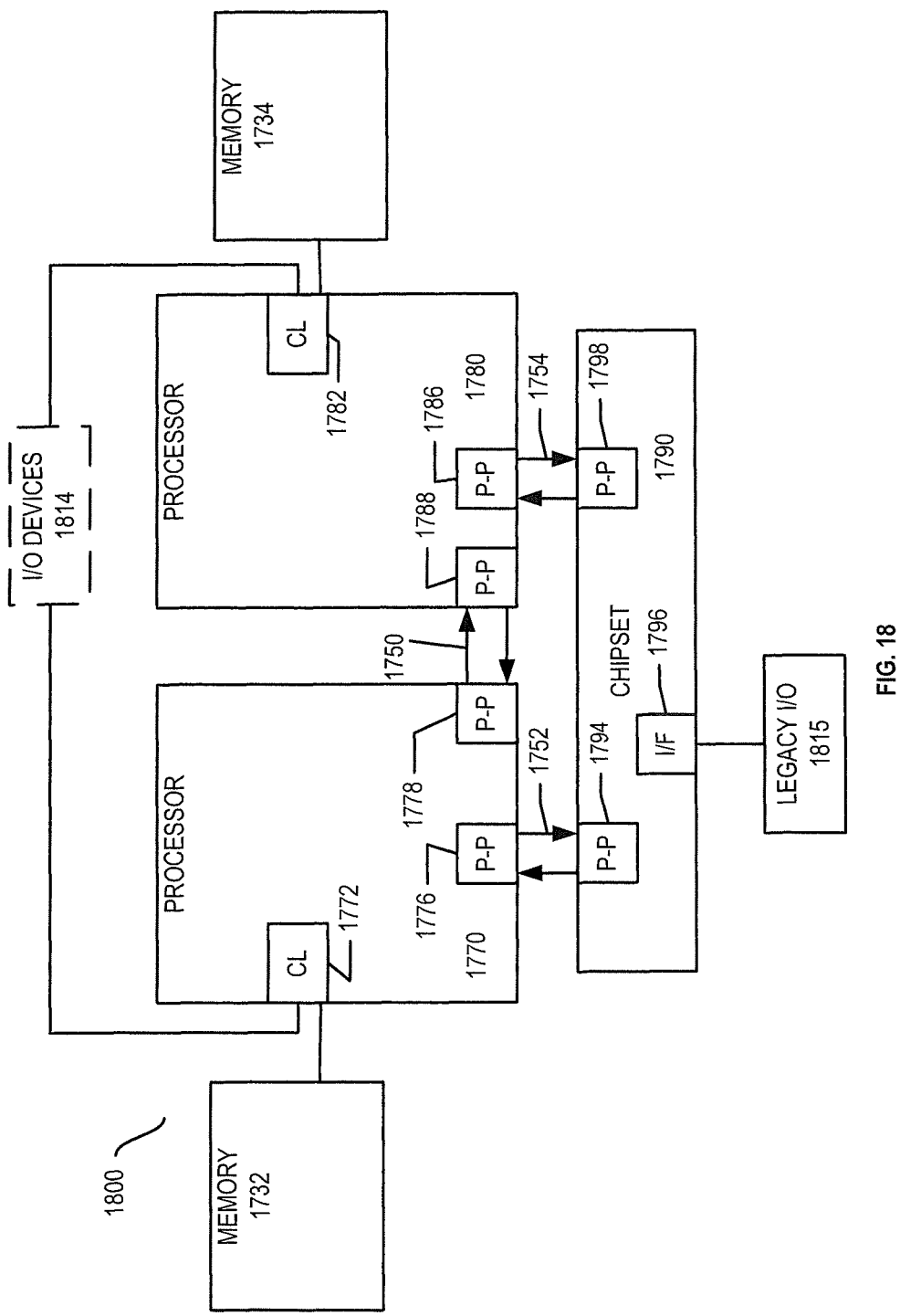
FIG. 18 shown is a block diagram of a second more specific exemplary system in accordance with an embodiment of the present invention.

Referring now to FIG. 18, shown is a block diagram of a second more specific exemplary system 1800 in accordance with an embodiment of the present invention. Like elements in FIGS. 17 and 18 bear like reference numerals, and certain aspects of FIG. 17 have been omitted from FIG. 18 in order to avoid obscuring other aspects of FIG. 18.

FIG. 18 illustrates that the processors 1770, 1780 may include integrated memory and I/O control logic ("CL") 1772 and 1782, respectively. Thus, the CL 1772, 1782 include integrated memory controller units and include I/O control logic. FIG. 18 illustrates that not only are the memories 1732, 1734 coupled to the CL 1772, 1782, but also that I/O devices 1814 are also coupled to the control logic 1772, 1782. Legacy I/O devices 1815 are coupled to the chipset 1790.

Figure 19:
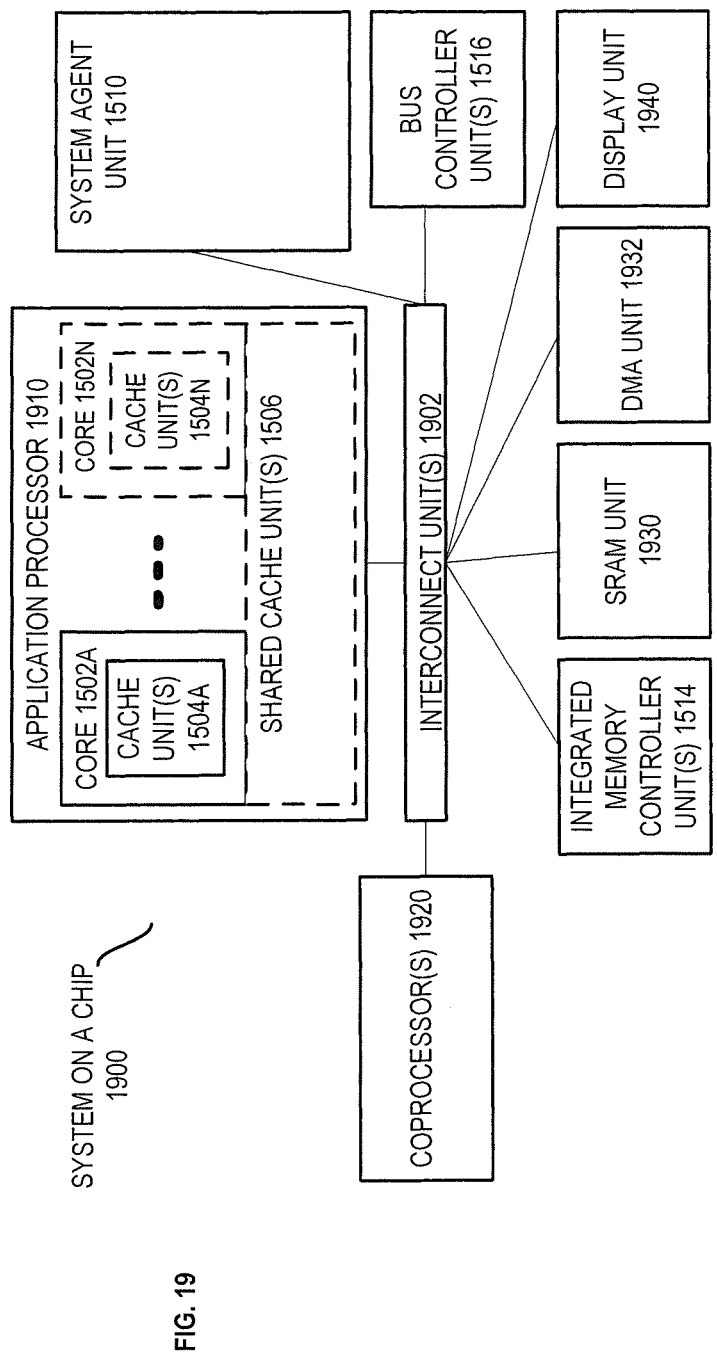
FIG. 19 shown is a block diagram of a SoC in accordance with an embodiment of the present invention.

Referring now to FIG. 19, shown is a block diagram of a SoC 1900 in accordance with an embodiment of the present invention. Similar elements in FIG. 15 bear like reference numerals. Also, dashed lined boxes are optional features on more advanced SoCs. In FIG. 19, an interconnect unit(s) 1902 is coupled to: an application processor 1910 which includes a set of one or more cores 202A-N and shared cache unit(s) 1506; a system agent unit 1510; a bus controller unit(s) 1516; an integrated memory controller unit(s) 1514; a set or one or more coprocessors 1920 which may include integrated graphics logic, an image processor, an audio processor, and a video processor; an static random access memory (SRAM) unit 1930; a direct memory access (DMA) unit 1932; and a display unit 1940 for coupling to one or more external displays. In one embodiment, the coprocessor(s) 1920 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1730 illustrated in FIG. 17, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 20 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 20 shows a program in a high level language 2002 may be compiled using an x86 compiler 2004 to generate x86 binary code 2006 that may be natively executed by a processor with at least one x86 instruction set core 2016. The processor with at least one x86 instruction set core 2016 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 2004 represents a compiler that is operable to generate x86 binary code 2006 (e.g., object code) that can, with or without additional linkage processing, be executed on the processor with at least one x86 instruction set core 2016. Similarly, FIG. 20 shows the program in the high level language 2002 may be compiled using an alternative instruction set compiler 2008 to generate alternative instruction set binary code 2010 that may be natively executed by a processor without at least one x86 instruction set core 2014 (e.g., a processor with cores that execute the MIPS instruction set of MIPS Technologies of Sunnyvale, Calif. and/or that execute the ARM instruction set of ARM Holdings of Sunnyvale, Calif.). The instruction converter 2012 is used to convert the x86 binary code 2006 into code that may be natively executed by the processor without an x86 instruction set core 2014. This converted code is not likely to be the same as the alternative instruction set binary code 2010 because an instruction converter capable of this is difficult to make; however, the converted code will accomplish the general operation and be made up of instructions from the alternative instruction set. Thus, the instruction converter 2012 represents software, firmware, hardware, or a combination thereof that, through emulation, simulation or any other process, allows a processor or other electronic device that does not have an x86 instruction set processor or core to execute the x86 binary code 2006.

Components, features, and details described for any of FIG. 2 or 4 may also optionally be used in any of FIGS. 1, 3, and 5. Components, features, and details described for any of FIG. 2, 7, or 9 may also optionally be used in any of FIG. 6 or 9. Moreover, components, features, and details described herein for any of the apparatus may also optionally be used in any of the methods described herein, which in embodiments may be performed by and/or with such the apparatus.

In the description and claims, the terms "coupled" and/or "connected," along with their derivatives, have be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other. For example, an execution unit may be coupled with a register or a decode unit through one or more intervening components. In the figures, arrows are used to show connections and couplings.

In the description and claims, the term "logic" may have been used. As used herein, logic may include hardware, firmware, software, or various combinations thereof. Examples of logic include integrated circuitry, application specific integrated circuits, analog circuits, digital circuits, programmed logic devices, memory devices including instructions, etc. In some embodiments, hardware logic may include transistors and/or gates potentially along with other circuitry components. In some embodiments, the logic may be embodied as a component, unit, or other module.

In the description above, specific details have been set forth in order to provide a thorough understanding of the embodiments. However, other embodiments may be practiced without some of these specific details. The scope of the invention is not to be determined by the specific examples provided above but only by the claims below. In other instances, well-known circuits, structures, devices, and operations have been shown in block diagram form or without detail in order to avoid obscuring the understanding of the description.

Various operations and methods have been described. Some of the methods have been described in a relatively basic form in the flow diagrams, but operations may optionally be added to and/or removed from the methods. For example, additional microarchitectural details may be added to the described methods of processing instructions. In addition, while operations have been described in a certain order according to example embodiments, that particular order is exemplary. Alternate embodiments may optionally perform the operations in different order, combine certain operations, overlap certain operations, etc.

Certain operations may be performed by hardware components, or may be embodied in machine-executable or circuit-executable instructions, that may be used to cause and/or result in a machine, circuit, or hardware component (e.g., a processor, potion of a processor, circuit, etc.) programmed with the instructions performing the operations. The operations may also optionally be performed by a combination of hardware and software. A processor, machine, circuit, or hardware may include specific or particular circuitry or other logic (e.g., hardware potentially combined with firmware and/or software) is operable to execute and/or process the instruction and store a result in response to the instruction.

Some embodiments include an article of manufacture (e.g., a computer program product) that includes a machine-readable medium. The medium may include a mechanism that provides, for example stores, information in a form that is readable by the machine. The machine-readable medium may provide, or have stored thereon, an instruction or sequence of instructions, that if and/or when executed by a machine are operable to cause the machine to perform and/or result in the machine performing one or operations, methods, or techniques disclosed herein. The machine-readable medium may provide, for example store, one or more of the embodiments of the instructions disclosed herein.

In some embodiments, the machine-readable medium may include a tangible and/or non-transitory machine-readable storage medium. For example, the tangible and/or non-transitory machine-readable storage medium may include a floppy diskette, an optical storage medium, an optical disk, an optical data storage device, a CD-ROM, a magnetic disk, a magneto-optical disk, a read only memory (ROM), a programmable ROM (PROM), an erasable-and-programmable ROM (EPROM), an electrically-erasable-and-programmable ROM (EEPROM), a random access memory (RAM), a static-RAM (SRAM), a dynamic-RAM (DRAM), a Flash memory, a phase-change memory, a phase-change data storage material, a non-volatile memory, a non-volatile data storage device, a non-transitory memory, a non-transitory data storage device, or the like. The non-transitory machine-readable storage medium does not consist of a transitory propagated signal.

Examples of suitable machines include, but are not limited to, general-purpose processors, special-purpose processors, instruction processing apparatus, digital logic circuits, integrated circuits, and the like. Still other examples of suitable machines include computing devices and other electronic devices that incorporate such processors, instruction processing apparatus, digital logic circuits, or integrated circuits. Examples of such computing devices and electronic devices include, but are not limited to, desktop computers, laptop computers, notebook computers, tablet computers, netbooks, smartphones, cellular phones, servers, network devices (e.g., routers and switches.), Mobile Internet devices (MIDs), media players, smart televisions, nettops, set-top boxes, and video game controllers.

Reference throughout this specification to "one embodiment," "an embodiment," "one or more embodiments," "some embodiments," for example, indicates that a particular feature may be included in the practice of the invention but is not necessarily required to be. Similarly, in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects lie in less than all features of a single disclosed embodiment. Thus, the claims following the Detailed Description are hereby expressly incorporated into this Detailed Description, with each claim standing on its own as a separate embodiment of the invention.

EXAMPLE EMBODIMENTS

The following examples pertain to further embodiments. Specifics in the examples may be used anywhere in one or more embodiments.

Example 1 is a processor including a plurality of packed data registers, and a decode unit to decode a packed variable length code point length determination instruction. The packed variable length code point length determination instruction is to indicate a first source packed data that is to have a plurality of packed variable length code points that are each to represent a character. The packed variable length code point length determination instruction is also to indicate a destination storage location. The processor also includes an execution unit coupled with the decode unit and the packed data registers. The execution unit, in response to the packed variable length code point length determination instruction, is to store a result packed data in the indicated destination storage location, the result packed data to have a length for each of the plurality of the packed variable length code points.

Example 2 includes the processor of Example 1, optionally in which the instruction is to indicate the first source packed data having the plurality of packed UTF-8 code points.

Example 3 includes the processor of Example 1, optionally in which the instruction is to indicate a plurality of signature patterns that are each to correspond to one of the different lengths of the variable length code points.

Example 4 includes the processor of Example 3, in which the execution unit, in response to the instruction, is to determine that a given variable length code point matches a given signature pattern by comparing the given variable length code point with each of the plurality of signature patterns, and in which the execution unit, in response to the instruction, is to store a length corresponding to the given signature pattern for the given variable length code point in the destination storage location.

Example 5 includes the processor of Example 3, in which the instruction is to indicate a second source packed data that is to have the plurality of signature patterns, and in which the instruction is to have an immediate to indicate a plurality of lengths that are each to correspond to one of the plurality of the signature patterns.

Example 6 includes the processor of Example 5, in which the plurality of the signature patterns are to include four different signature patterns, and in which the immediate is to have four fields that are each to indicate a corresponding length of a different one of the four signature patterns.

Example 7 includes the processor of Example 3, in which the signature patterns are to be stored in a non-volatile memory of the processor that is not an architectural register.

Example 8 includes the processor of any preceding Example, optionally in which the execution unit, in response to the instruction, is to store each length in a byte that is to be in a same relative bit position in the destination storage location as a least significant byte of the corresponding variable length code point in the first source packed data.

Example 9 includes the processor of Example 8, in which the execution unit, in response to the instruction, is to store a length indicative of three bytes in a given byte that is to be in a same relative bit position in the destination storage location as a least significant byte of a corresponding three byte code point in the first source packed data, and is to store all zeros in a two more significant consecutive bytes that are to be more significant than the given byte in the destination storage location.

Example 10 includes the processor of any preceding Example, optionally in which the execution unit, in response to the instruction, is to store all binary ones in bytes in same relative bit positions in the destination storage location as bytes of incomplete or invalid variable length code points of the first source packed data.

Example 11 is a method performed by a processor. The method includes receiving a packed variable length code point length determination instruction. The packed variable length code point length determination instruction indicates a first source packed data having a plurality of packed variable length code points each representing a character, and indicates a destination storage location. The method includes storing a result packed data in the indicated destination storage location in response to the packed variable length code point length determination instruction. The result packed data has a length for each of the plurality of packed variable length code points.

Example 12 includes the method of Example 11, optionally in which receiving includes receiving the instruction indicating the first source packed data having the plurality of packed UTF-8 code points.

Example 13 includes the method of Example 11, optionally in which receiving includes receiving the instruction indicating a plurality of signature patterns each corresponding to one of the different lengths of the variable length code points.

Example 14 includes the method of Example 13, further optionally including determining that a given variable length code point matches a given signature pattern by comparing the given variable length code point with each of the plurality of signature patterns. The method may also optionally include storing a length corresponding to the given signature pattern for the given variable length code point in the destination storage location.

Example 15 includes the method of Example 13, in which receiving includes receiving the instruction indicating a second source packed data having the plurality of signature patterns. The instruction may optionally have an immediate indicating a plurality of lengths each corresponding to one of the plurality of signature patterns.

Example 16 includes the method of Example 15, in which the plurality of signature patterns include four different signature patterns. Optionally, each of the four different signature patterns may be stored in a different 32-bit data element of the second source packed data which is at least 128-bits wide. Optionally, the immediate may have four fields each corresponding to a different one of the four signature patterns to indicate a corresponding length.

Example 17 includes the method of Example 13, in which receiving includes receiving the instruction indicating the signature patterns which are stored in an on-die non-volatile memory of the processor.

Example 18 includes the method of any preceding Example, optionally in which storing includes storing each length in a byte that is in a same relative bit position in the destination storage location as a least significant byte of the corresponding variable length code point in the first source packed data.

Example 19 includes the method of Example 18, in which storing includes storing a length indicative of two bytes in a given byte that is in a same relative bit position in the destination storage location as a least significant byte of a corresponding two byte code point in the first source packed data. Optionally, all zeros may be stored in a more significant consecutive byte that is more significant than the given byte in the destination storage location.

Example 20 includes the method of any preceding Example, optionally in which storing includes storing all ones in bytes in same relative bit positions in the destination storage location as bytes of incomplete or invalid variable length code points of the first source packed data.

Example 21 includes the method of Example 20, further optionally including executing one or more other instructions to determine a position of a most significant byte storing all ones and indicative of an incomplete variable length code point. The determined position of the most significant byte may optionally be used to load another contiguous portion of variable length code points.

Example 22 is a system to process instructions including an interconnect, a processor coupled with the interconnect, and a dynamic random access memory (DRAM) coupled with the interconnect. The DRAM is to store a transcoding algorithm having a packed variable length code point length determination instruction. The packed variable length code point length determination instruction is to indicate a first source packed data that is to have a plurality of packed variable length code points that are each to represent a character. The packed variable length code point length determination instruction is to indicate a destination storage location. The packed variable length code point length determination instruction, if executed by the processor, is operable to cause the processor to perform operations including storing a result packed data in the indicated destination storage location, the result packed data to have a length for each of the plurality of the packed variable length code points.

Example 23 includes the system of Example 22, in which the instruction is to indicate the first source packed data having the plurality of packed UTF-8 code points. Optionally, the instruction may indicate a plurality of signature patterns that are each to correspond to one of the different lengths of the UTF-8 code points.

Example 24 is an article of manufacture including a non-transitory machine-readable storage medium. The machine-readable storage medium storing a packed variable length code point length determination instruction. The packed variable length code point length determination instruction may indicate a first source packed data that is to have a plurality of packed variable length code points that are each to represent a character. The packed variable length code point length determination instruction may indicate a destination storage location. The packed variable length code point length determination instruction if executed by a machine is to cause the machine to perform operations including storing a result packed data in the indicated destination storage location, the result packed data to have a length for each of the plurality of the packed variable length code points.

Example 25 includes the article of manufacture of Example 24, in which the instruction is to indicate the first source packed data that is to include UTF-8 code points. Optionally, the instruction may indicate a plurality of signature patterns that are each to correspond to one of the different lengths of the UTF-8 code points.

Example 26 is a method performed by a processor. The method includes receiving a packed variable length code point character bits extraction instruction. The packed variable length code point character bits extraction instruction is to indicate a first source packed data having a plurality of packed variable length code points each representing a character. The instruction is also to indicate a second source packed data having packed lengths of validated variable length code points from the first source packed data, and indicating a destination storage location. The method includes storing a result packed data in the indicated destination storage location in response to the packed variable length code point character bits extraction instruction. The result packed data has packed sets of extracted character bits. Each set of extracted character bits corresponding to a different one of the validated variable length code points from the first source packed data. Each set of extracted character bits may be sufficient to determine the character represented by the variable length code points.

Example 27 includes the method of Example 26, in which receiving includes receiving the instruction indicating the first source packed data having the plurality of packed UTF-8 code points.

Example 28 includes the method of Example 26, in which receiving includes receiving the instruction indicating a plurality of signature patterns each corresponding to one of the different lengths of the variable length code points.

Example 29 includes the method of Example 28, further optionally including selecting a signature pattern for a given variable length code point from the first source packed data by using a length corresponding to the given variable length code point from the second source packed data. The method may also optionally include removing signature bits from the given variable length code point by performing a logical operation on the given variable length code point and the selected signature pattern.

Example 30 includes the method of Example 28, in which receiving includes receiving the instruction indicating the signature patterns which are stored in a non-volatile memory of the processor.

Example 31 includes the method of any preceding Example, in which receiving includes receiving the instruction indicating the destination storage location which is four times as wide in bits as the first source packed data. Optionally, each of the sets of extracted character bits may be stored in 32-bits of the destination storage location.

Example 32 includes the method of any preceding Example, optionally in which the first source packed data is at least 128-bits and the destination storage location is at least 512-bits.

Example 33 includes the method of any preceding Example, in which receiving includes receiving the instruction indicating a second destination storage location, and further including storing a number of validated variable length code points extracted in the second destination storage location.

Example 34 is a machine-readable storage medium storing instructions that if executed by a machine are to cause the machine to perform the method of any of claims 13-21.

Example 35 is an apparatus to perform the method of any of claims 13-21.

Example 36 is an apparatus including means for performing the method of any of claims 13-21.

Example 37 is a machine-readable storage medium storing instructions that if executed by a machine are to cause the machine to perform the method of any of claims 26-33.

Example 38 is an apparatus to perform the method of any of claims 26-33.

Example 39 is an apparatus including means for performing the method of any of claims 26-33.

Example 40 is an apparatus to execute an instruction substantially as described herein.

Example 41 is an apparatus including means for performing an instruction substantially as described herein.

What is claimed is:

1. A processor comprising:
   a plurality of packed data registers;
   a decode unit to decode a packed variable length code point length determination instruction, the packed variable length code point length determination instruction to indicate a first source packed data that is to have a plurality of packed variable length code points that are each to represent a character, and the packed variable length code point length determination instruction to indicate a destination storage location; and
   an execution unit coupled with the decode unit and the packed data registers, the execution unit, in response to the packed variable length code point length determination instruction, to store a result packed data in the indicated destination storage location, the result packed data to have bits to indicate a length for each of the plurality of the packed variable length code points of the first source packed data,
   wherein the result packed data is not to include the packed variable length code points.

2. The processor of claim 1, wherein the instruction is to indicate the first source packed data that is to have a plurality of packed Universal Character Set (UCS) Transformation Format-8-bit (UTF-8) code points.

3. The processor of claim 1, wherein the instruction is to indicate a plurality of signature patterns that are each to correspond to one of a plurality of different lengths of the variable length code points.

4. The processor of claim 3, wherein the execution unit, in response to the instruction, is to determine that a given variable length code point matches a given signature pattern by comparing the given variable length code point with each of the plurality of signature patterns, and wherein the execution unit, in response to the instruction, is to store a length corresponding to the given signature pattern for the given variable length code point in the destination storage location.

5. A processor comprising:
   a plurality of packed data registers;
   a decode unit to decode a packed variable length code point length determination instruction, the packed variable length code point length determination instruction to indicate a first source packed data that is to have a plurality of packed variable length code points that are each to represent a character, the packed variable length code point length determination instruction to indicate a plurality of signature patterns that are each to correspond to one of a plurality of different lengths of the variable length code points, and the packed variable length code point length determination instruction to indicate a destination storage location; and
   an execution unit coupled with the decode unit and the packed data registers, the execution unit, in response to the packed variable length code point length determination instruction, to store a result packed data in the indicated destination storage location, the result packed data to have bits to indicate a length for each of the plurality of the packed variable length code points of the first source packed data,
   wherein the instruction is to indicate a second source packed data that is to have the plurality of signature patterns, and wherein the instruction is to have an immediate to indicate a plurality of lengths that are each to correspond to one of the plurality of the signature patterns.

6. The processor of claim 5, wherein the plurality of the signature patterns are to include four different signature patterns, and wherein the immediate is to have four fields that are each to indicate a corresponding length of a different one of the four signature patterns.

7. A processor comprising:
   a plurality of packed data registers;
   a decode unit to decode a packed variable length code point length determination instruction, the packed variable length code point length determination instruction to indicate a first source packed data that is to have a plurality of packed variable length code points that are each to represent a character, the packed variable length code point length determination instruction to indicate a plurality of signature patterns that are each to correspond to one of a plurality of different lengths of the variable length code points, and the packed variable length code point length determination instruction to indicate a destination storage location; and
   an execution unit coupled with the decode unit and the packed data registers, the execution unit, in response to the packed variable length code point length determination instruction, to store a result packed data in the indicated destination storage location, the result packed data to have bits to indicate a length for each of the plurality of the packed variable length code points of the first source packed data,
   wherein the signature patterns are to be stored in a non-volatile memory of the processor that is not an architectural register.

8. A processor comprising:
   a plurality of packed data registers;
   a decode unit to decode a packed variable length code point length determination instruction, the packed variable length code point length determination instruction to indicate a first source packed data that is to have a plurality of packed variable length code points that are each to represent a character, and the packed variable length code point length determination instruction to indicate a destination storage location; and an execution unit coupled with the decode unit and the packed data registers, the execution unit, in response to the packed variable length code point length determination instruction, to store a result packed data in the indicated destination storage location, the result packed data to have bits to indicate a length for each of the plurality of the packed variable length code points of the first source packed data, wherein the execution unit, in response to the instruction, is to store each length in a byte that is to be in a same relative bit position in the destination storage location as a least significant byte of the corresponding variable length code point in the first source packed data.

9. The processor of claim 8, wherein the execution unit, in response to the instruction, is to store a length indicative of three bytes in a given byte that is to be in a same relative bit position in the destination storage location as a least significant byte of a corresponding three byte code point in the first source packed data, and is to store all zeros in a set of two more significant consecutive bytes that are to be more significant than the given byte in the destination storage location.

10. A processor comprising:
a plurality of packed data registers;
a decode unit to decode a packed variable length code point length determination instruction, the packed variable length code point length determination instruction to indicate a first source packed data that is to have a plurality of packed variable length code points that are each to represent a character, and the packed variable length code point length determination instruction to indicate a destination storage location; and
an execution unit coupled with the decode unit and the packed data registers, the execution unit, in response to the packed variable length code point length determination instruction, to store a result packed data in the indicated destination storage location, the result packed data to have bits to indicate a length for each of the plurality of the packed variable length code points of the first source packed data,
wherein the execution unit, in response to the instruction, is to store all binary ones in bytes in same relative bit positions in the destination storage location as bytes of incomplete or invalid variable length code points of the first source packed data.

11. A method performed by a processor comprising:
receiving a packed variable length code point length determination instruction, the packed variable length code point length determination instruction indicating a first source packed data having a plurality of packed variable length code points each representing a character, and indicating a destination storage location; and
storing a result packed data in the indicated destination storage location in response to the packed variable length code point length determination instruction, the result packed data have bits to indicate a length for each of the plurality of packed variable length code points of the first source packed data, wherein storing comprises storing each length in a byte that is in a same relative bit position in the destination storage location as a least significant byte of the corresponding variable length code point in the first source packed data.

12. The method of claim 11, wherein receiving comprises receiving the instruction indicating the first source packed data having a plurality of packed Universal Character Set (UCS) Transformation Format-8-bit (UTF-8) code points.

13. The method of claim 11, wherein receiving comprises receiving the instruction indicating a plurality of signature patterns each corresponding to one of a plurality of different lengths of the variable length code points.

14. The method of claim 13, further comprising:
determining that a given variable length code point matches a given signature pattern by comparing the given variable length code point with each of the plurality of signature patterns; and
storing a length corresponding to the given signature pattern for the given variable length code point in the destination storage location.

15. The method of claim 13, wherein receiving comprises receiving the instruction indicating a second source packed data having the plurality of signature patterns, and having an immediate indicating a plurality of lengths each corresponding to one of the plurality of signature patterns.

16. The method of claim 15, wherein the plurality of signature patterns include four different signature patterns, wherein each of the four different signature patterns is stored in a different 32-bit data element of the second source packed data which is at least 128-bits wide, and wherein the immediate has four fields each corresponding to a different one of the four signature patterns to indicate a corresponding length.

17. The method of claim 13, wherein receiving comprises receiving the instruction indicating the signature patterns which are stored in an on-die non-volatile memory of the processor.

18. The method of claim 11, wherein storing comprises storing a length indicative of two bytes in a given byte that is in a same relative bit position in the destination storage location as a least significant byte of a corresponding two byte code point in the first source packed data, and storing all zeros in a more significant consecutive byte that is more significant than the given byte in the destination storage location.

19. The method of claim 11, wherein storing comprises storing all ones in bytes in same relative bit positions in the destination storage location as bytes of incomplete or invalid variable length code points of the first source packed data.

20. The method of claim 19, further comprising:
executing one or more other instructions to determine a position of a most significant byte storing all ones and indicative of an incomplete variable length code point; and
using the determined position of the most significant byte to load another contiguous portion of variable length code points.

21. A processor comprising:
a plurality of packed data registers;
a decode unit to decode a packed variable length code point length determination instruction, the packed variable length code point length determination instruction to indicate a first source packed data that is to have a plurality of packed variable length code points that are each to represent a character, and the packed variable length code point length determination instruction to indicate a destination storage location; and
an execution unit coupled with the decode unit and the packed data registers, the execution unit, in response to the packed variable length code point length determination instruction, to store a result packed data in the indicated destination storage location, the result packed data to have bits to indicate a length for each of the plurality of the packed variable length code points of the first source packed data, wherein the execution unit is not to transcode the plurality of packed variable length code points in response to the instruction.

22. The processor of claim 1, wherein the first source packed data does not indicate lengths of the variable length code points.

* * * * *